(12) United States Patent
Chang et al.

(10) Patent No.: US 10,153,302 B2
(45) Date of Patent: Dec. 11, 2018

(54) PIXEL STRUCTURE

(71) Applicant: Chunghwa Picture Tubes, LTD., Taoyuan (TW)

(72) Inventors: Hsi-Ming Chang, Taoyuan (TW); Yen-Yu Huang, Taoyuan (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 51 days.

(21) Appl. No.: 14/829,179

(22) Filed: Aug. 18, 2015

(65) Prior Publication Data

US 2017/0053945 A1 Feb. 23, 2017

(51) Int. Cl.
*H01L 27/12* (2006.01)

(52) U.S. Cl.
CPC ........ *H01L 27/1225* (2013.01); *H01L 27/124* (2013.01); *H01L 27/127* (2013.01); *H01L 27/1248* (2013.01); *H01L 27/1262* (2013.01); *H01L 27/1288* (2013.01)

(58) Field of Classification Search
CPC ... H01L 27/122; H01L 27/124; H01L 27/126; H01L 27/127
USPC ................. 257/40–43, 46; 438/24
See application file for complete search history.

(56) References Cited

U.S. PATENT DOCUMENTS

| 2005/0148123 | A1 | 7/2005 | Mao-Tsum |
| 2014/0167040 | A1* | 6/2014 | Lee ............... H01L 29/66969 257/43 |
| 2015/0099333 | A1 | 4/2015 | Yamazaki et al. |
| 2015/0221674 | A1* | 8/2015 | Cheng ............ H01L 27/1225 257/43 |

FOREIGN PATENT DOCUMENTS

| TW | 494580 | 7/2002 |
| TW | I475615 | 3/2015 |

* cited by examiner

*Primary Examiner* — Ori Nadav
*Assistant Examiner* — Vernon P Webb
(74) *Attorney, Agent, or Firm* — J.C. Patents

(57) ABSTRACT

A method for manufacturing a pixel structure is provided. A patterned semiconductor material layer, an insulation material layer, and a gate electrode material layer are formed in sequence on a substrate to form a stacked structure. A patterned photoresist layer is formed on the stacked structure by using a photomask. A portion of the stacked structure is removed to pattern the patterned semiconductor material layer into a patterned semiconductor layer by using the patterned photoresist layer as a mask. Another portion of the stacked structure is etched by using a portion of the patterned photoresist layer as a mask until a portion of the semiconductor layer in the stacked structure is exposed. Then, an exposed portion of the semiconductor layer is modified to increase a conductivity of the exposed portion of the semiconductor layer. Finally, the patterned photoresist layer is removed. A pixel structure manufactured by the method is provided.

7 Claims, 26 Drawing Sheets

PIXEL STRUCTURE

BACKGROUND

Field of the Invention

The invention relates to a pixel structure and a manufacturing method thereof. In particular, the invention relates to a pixel structure with a patterned oxide semiconductor layer.

Description of Related Art

In general, the conventional manufacturing process of a pixel structure having an oxide semiconductor layer substantially involves six masking steps. With the first masking step, a gate electrode is formed on a substrate. Then, a gate insulating layer is comprehensively formed on the substrate for covering the gate electrode. Next, with the second masking step, an oxide semiconductor layer is formed on the gate insulating layer above the gate electrode. Furthermore, with the third masking step, an etching stop layer is formed on a portion of the oxide semiconductor layer. Afterward, a metal layer is formed on the etching stop layer; and with the fourth masking step, a source electrode and a drain electrode, which are electrically insulated with each other, are separately defined on two sides of the etching stop layer. Then, an insulating layer is formed on the substrate for covering the source electrode and the drain electrode. After that, with the fifth masking step, a contact window is formed on the insulating layer in order to expose the drain electrode. Finally, with the sixth masking step, a pixel electrode is formed on the substrate, and this pixel electrode fills up the contact window and is electrically connected with the drain electrode. At this point, the manufacturing of the pixel structure having the oxide semiconductor layer is completed. Nevertheless, the abovementioned manufacturing process of the pixel structure is complicated, and has high production costs.

SUMMARY OF THE INVENTION

The invention is to provide a pixel structure and a manufacturing method thereof, capable of reducing production costs and simplifying the manufacturing process by reducing the number of masks.

The invention provides a method of forming a pixel structure. The method includes the following steps. A patterned semiconductor material layer, an insulation material layer, and a gate electrode material layer are formed in sequence on a substrate to form a stacked structure. Next, a patterned photoresist layer is formed on the stacked structure by using a photomask. The patterned photoresist layer comprises a first thickness portion covering a first portion of the stacked structure and a second thickness portion covering a second portion of the stacked structure, and the patterned photoresist layer exposes a third portion of the stacked structure. The third portion of the stacked structure is removed to pattern the patterned semiconductor material layer into a patterned semiconductor layer by using the patterned photoresist layer as a mask. The first thickness portion of the patterned photoresist layer is then removed and the second thickness portion of the patterned photoresist layer is thinned to expose the first portion of the stacked structure previously covered by the first thickness portion of the patterned photoresist layer. Next, the first portion of the stacked structure is etched by using the thinned second thickness portion of the patterned photoresist layer as a mask until an exposed portion of the patterned semiconductor layer in the first portion of the stacked structure is exposed. The gate electrode material layer is patterned into a gate electrode layer, and the insulation material layer is patterned into an insulation layer having a shape substantially conformal to the gate electrode layer and covering a covered portion of the patterned semiconductor layer. Then, the exposed portion of the patterned semiconductor layer is modified to increase a conductivity of the exposed portion of the patterned semiconductor layer. The thinned second thickness portion of the patterned photoresist layer is then removed. The covered portion of the patterned semiconductor layer includes a channel, and the exposed portion of the patterned semiconductor layer includes a source and a drain. The gate electrode layer includes a gate above the channel, and the gate, the channel, the source and the drain form a thin film transistor structure.

In an embodiment of the invention, the method further includes forming a patterned metal layer on the substrate prior to forming the stacked structure. The patterned metal layer includes a data line electrically connected to the source.

In an embodiment of the invention, the patterned semiconductor material layer has an opening exposing a portion of the data line and the patterned semiconductor layer patterned from the patterned semiconductor material layer includes a semiconductor portion and has a separating gap corresponding to the opening, such that the insulation layer patterned from the insulation material layer has a insulation portion filling the separating gap and contacting the portion of the data line and the semiconductor portion is electrically insulating to the data line.

In an embodiment of the invention, removing the first thickness portion of the patterned photoresist layer and the thinning the second thickness portion of the patterned photoresist layer includes performing an ashing process.

In an embodiment of the invention, the forming the patterned photoresist layer on the stacked structure includes using one half-tone photomask or one gray-tone photomask to form the first thickness portion and the second thickness portion.

In an embodiment of the invention, modifying the exposed portion of the patterned semiconductor layer includes performing a plasma treatment, an ion implanting, or a combination thereof.

In an embodiment of the invention, a processing gas of the plasma treatment includes hydrogen gas.

In an embodiment of the invention, removing the second thickness portion includes performing a stripping process.

In an embodiment of the invention, the method further includes forming a pixel electrode electrically connected to the drain.

In an embodiment of the invention, the formation of the pixel electrode is simultaneous to the formation of the source and the drain.

In an embodiment of the invention, the pixel electrode is formed by modifying the exposed portion of the patterned semiconductor layer.

The invention further provides a pixel structure. The pixel structure includes a pixel electrode, disposed on a substrate, a thin film transistor structure, and an insulation layer. The thin film transistor structure is disposed on the substrate and connected to the pixel electrode. The thin film transistor structure includes a source, a drain and a channel formed by a patterned semiconductor layer and a gate formed by a gate electrode layer. The source and the drain are located on two opposite sides of the channel, and the gate is located above the channel. The insulation layer is interposed between the patterned semiconductor layer and the gate electrode layer and has a shape substantially conformal to the gate electrode layer. The insulation layer covers an covered portion of the patterned semiconductor layer to form the channel and exposes an exposed portion of the patterned semiconductor layer to form the source and the drain.

In an embodiment of the invention, a material of the patterned semiconductor layer includes an oxide semiconductor material.

In an embodiment of the invention, the covered portion of the patterned semiconductor layer has a first conductivity type and the exposed portion of the patterned semiconductor layer has a second conductivity type more conductive than the first conductivity type.

In an embodiment of the invention, the exposed portion of the patterned semiconductor layer further includes the pixel electrode.

In an embodiment of the invention, the pixel structure further includes a data line disposed on the substrate, located between the patterned semiconductor layer and the substrate, and electrically connected to the source of the thin film transistor structure.

In an embodiment of the invention, the gate electrode layer further includes a gate line electrically connected to the gate of the thin film transistor structure. The insulation layer includes a insulation portion underlying the gate line. The patterned semiconductor layer further includes a semiconductor portion underlying the gate line, and the gate line, the insulation portion and the semiconductor portion form a gate line structure crossing over the data line.

In an embodiment of the invention, the patterned semiconductor layer has a separating gap exposing a portion of the data line, and the insulation portion fills the separating gap and contacts the portion of the data line. In addition, the semiconductor portion is electrically insulating to the data line.

In an embodiment of the invention, a portion of the source is in direct contact with the data line to electrically connect to the data line.

In an embodiment of the invention, the pixel structure further includes a patterned metal portion disposed on the substrate, located and electrically connected between the drain and the pixel electrode. A material of the patterned metal portion and the data line is the same.

Based on the above, in the manufacturing process of the pixel structure of the invention, the patterned photoresist layer is patterned to have a first thickness portion and a second thickness portion by using a photomask, and the following processes of forming the pixel structure use the patterned photoresist layer as a mask for forming multiple elements, such as the channel, the source, the drain, the gate and the gate insulation layer. Therefore, this allows the manufacture of the pixel structure of the invention to reduce the amount of photomasks required. Thus, the manufacturing cost of the pixel structure of the invention can be effectively lowered. Furthermore, in the pixel structure, the source and drain are electrically contacted with the channel without contact holes. In addition, the drain is electrically contacted with the pixel electrode without contact holes. The pixel structure according to the embodiment of the present invention has an improved resolution or aperture ratio. In addition, not requiring contact holes also saves space in the thin film transistor layout that utilizes the pixel structure.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A to FIG. 12A are schematic top views illustrating the manufacture process of a pixel structure according to an embodiment of the invention.

FIG. 1B to FIG. 12B are schematic cross-sectional views respectively taken along line A-A' in the corresponding FIG. 1A to FIG. 12A.

FIG. 13A to FIG. 24A are schematic top views illustrating the manufacture process of a pixel structure according to another embodiment of the invention.

FIG. 13B to FIG. 24B are schematic cross-sectional views respectively taken along line A-A' in the corresponding FIG. 13A to FIG. 24A.

DESCRIPTION OF THE EMBODIMENTS

Figure 1A:
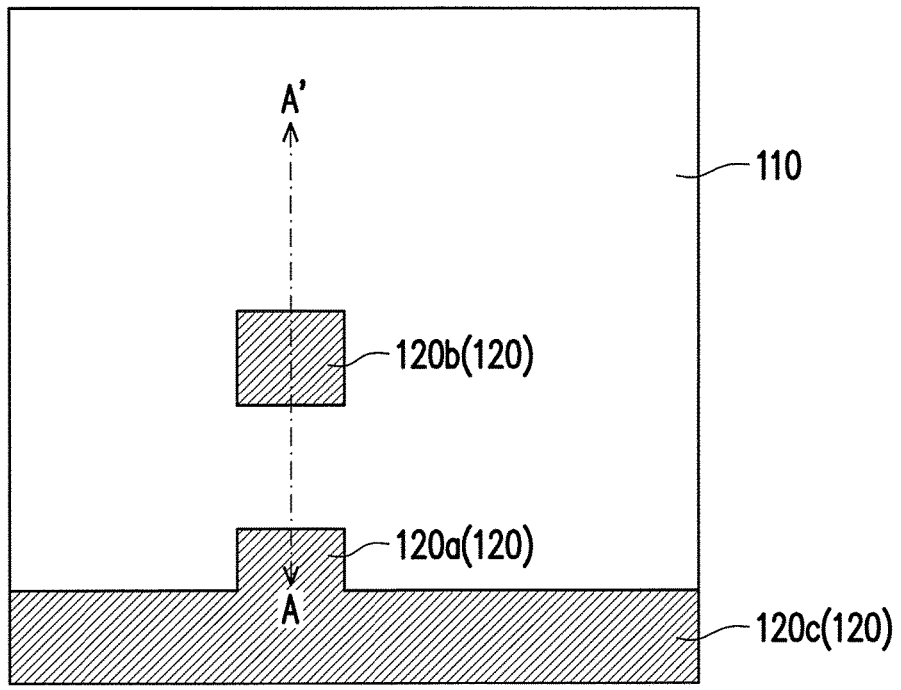

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 12A are schematic top views illustrating the manufacture process of a pixel structure according to an embodiment of the invention. FIG. 1B to FIG. 12B are schematic cross-sectional views respectively taken along line A-A' in the corresponding FIG. 1A to FIG. 12A. It should be noted that in FIG. 1A to FIG. 12A, if a boundary of a layer substantially overlaps with another layer, the schematic top views only label the top most layer. Thus, FIG. 1A to FIG. 12A have omitted the references for some of the components. Please refer to the corresponding schematic cross-sectional views (i.e., FIG. 1B to FIG. 12B) at the same time. The following uses FIG. 1A to FIG. 12A and FIG. 1B to FIG. 12B to describe the manufacture process of the pixel structure of an embodiment of the invention.

Figure 1B:
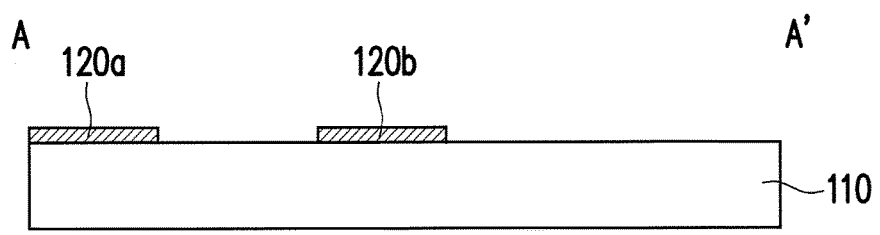

Referring to FIG. 1A and FIG. 1B, a metal layer (not shown) is first formed on a substrate 110. Next, the metal layer is patterned to form a patterned metal layer 120 on the substrate 110. The patterned metal layer includes a first metal portion 120a, a second metal portion 120b, and a data line 120c. The first metal portion 120a branches off of the data line 120c. A material of the patterned metal layer 120 is, for example, molybdenum, aluminum, titanium, indium tin oxide, or a combination thereof. However, the invention is not limited thereto.

Figure 2A:
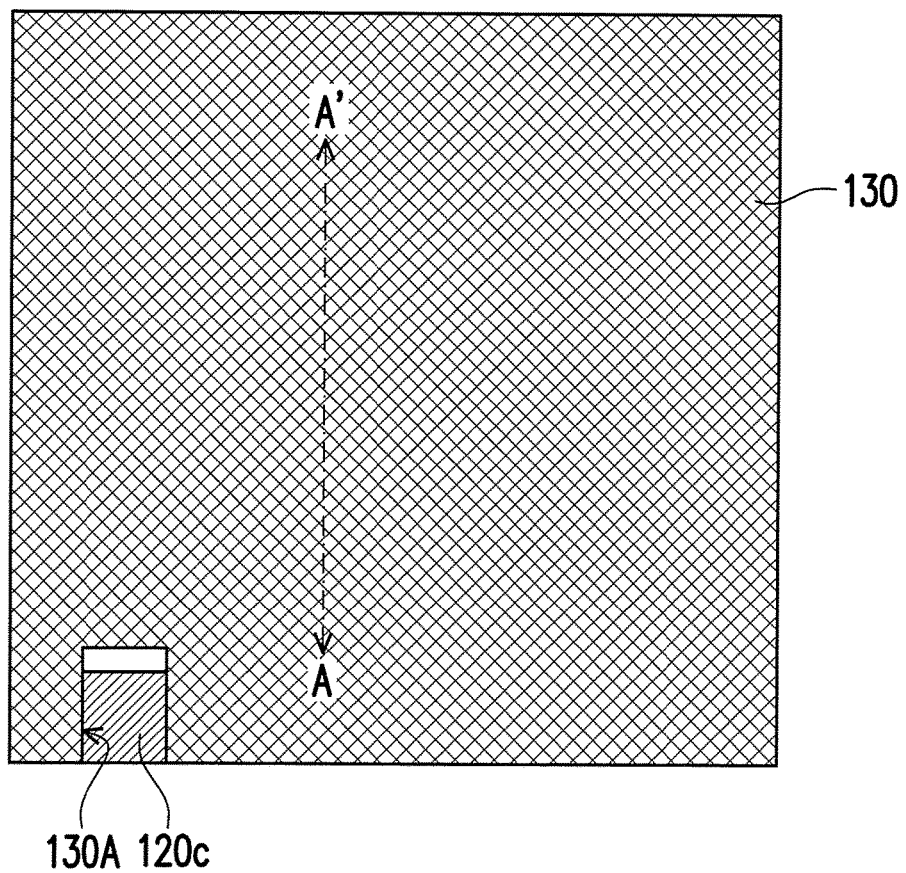
Figure 2B:
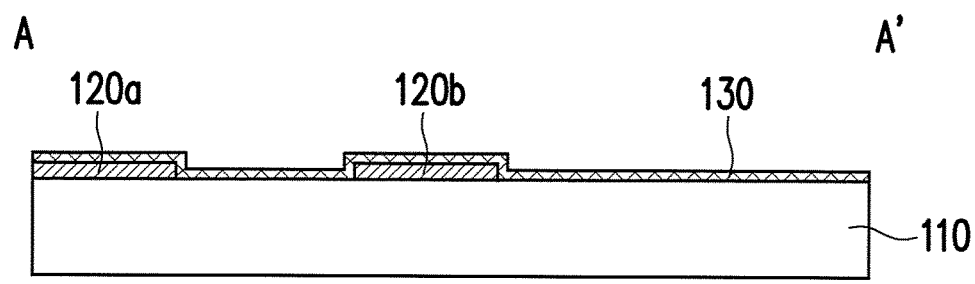

Referring to FIG. 2A and FIG. 2B, a patterned semiconductor material layer 130 is formed on the substrate 110. Particularly, the patterned semiconductor material layer 130 has an opening 130A exposing a portion of the data line 120c. A material of the patterned semiconductor material layer 130 is an oxide semiconductor material. For example, the material of the patterned semiconductor material layer 130 may be indium gallium zinc oxide, indium zinc oxide, indium gallium oxide, zinc oxide, tin oxide, gallium zinc oxide, zinc tin oxide, or indium tin oxide. However, the invention is not limited thereto. In addition, the opening 130A can be formed by performing a lithography-etching process.

Figure 3A:
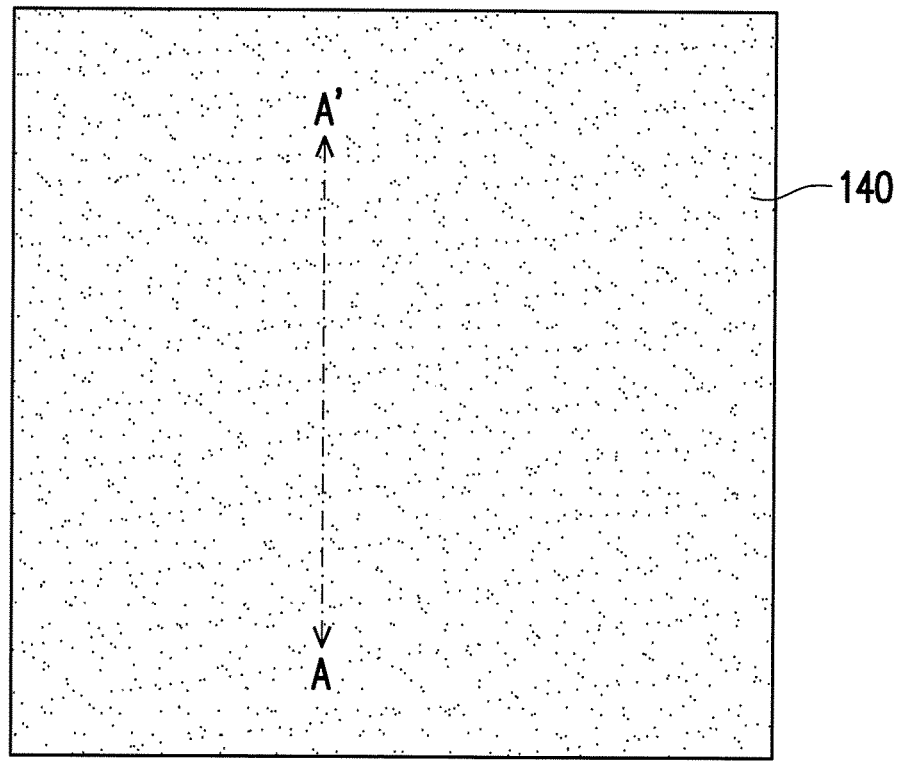
Figure 3B:
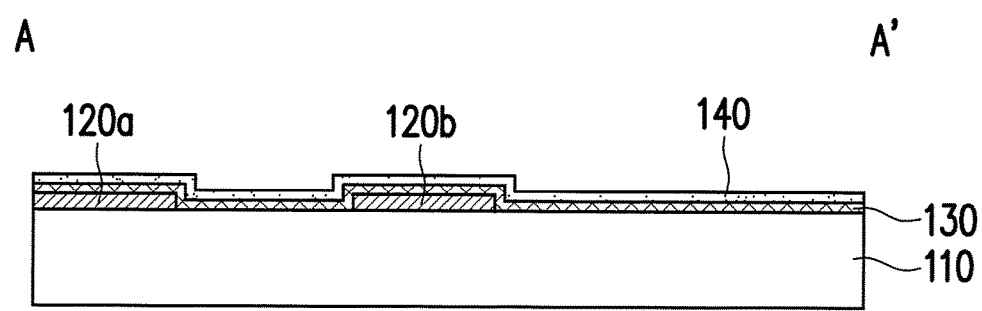

Referring to FIG. 3A and FIG. 3B, an insulation material layer 140 is formed on the patterned semiconductor material layer 130. A material of the insulation material layer 140 is for example, silicon dioxide. However, the invention is not limited thereto.

Figure 4A:
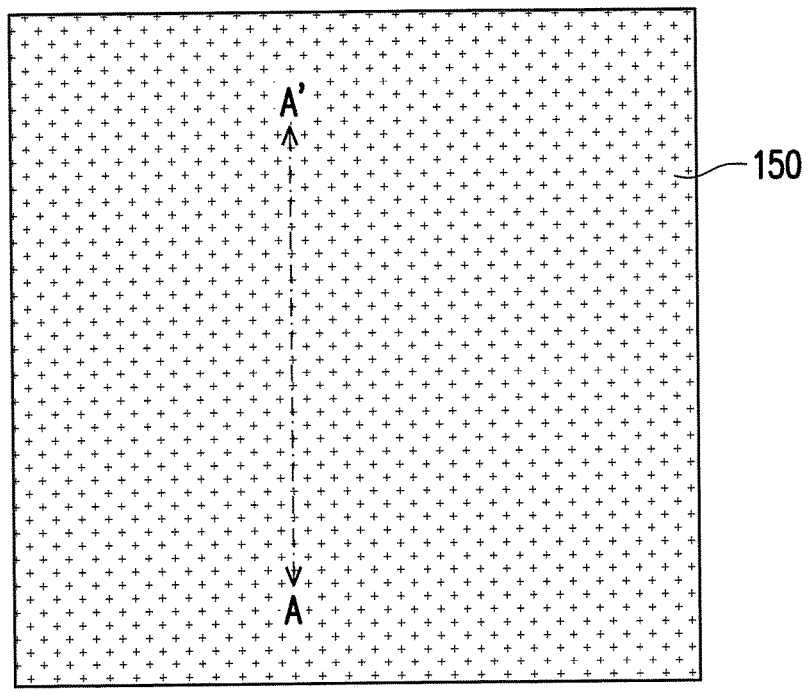
Figure 4B:
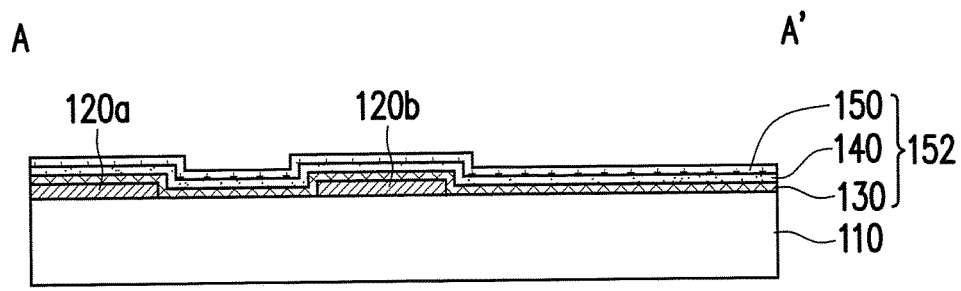

Referring to FIG. 4A and FIG. 4B, a gate electrode material layer 150 is formed on the insulation material layer 140. A material of the gate electrode material layer 150 is for example, molybdenum, aluminum, titanium, or a combination thereof. However, the invention is not limited thereto.

Thus, it can be seen that the patterned semiconductor material layer 130, the insulation material layer 140, and the gate electrode material layer 150 are formed in sequence on the substrate 110 to form a stacked structure 152.

Figure 5A:
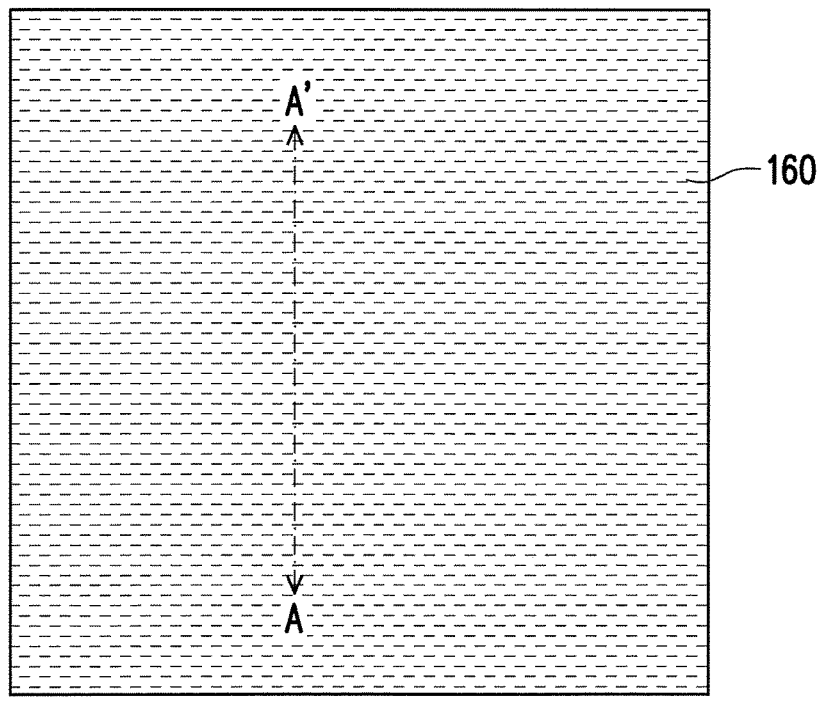
Figure 5B:
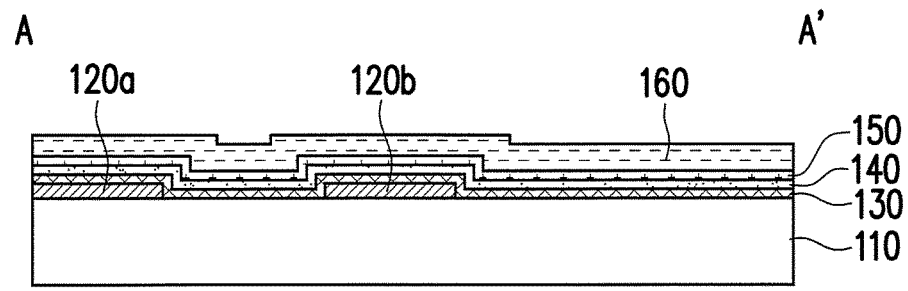

Referring to FIG. 5A and FIG. 5B, a photoresist layer 160 is formed on the gate electrode material layer 150 by using a photosensitive material.

Figure 6A:
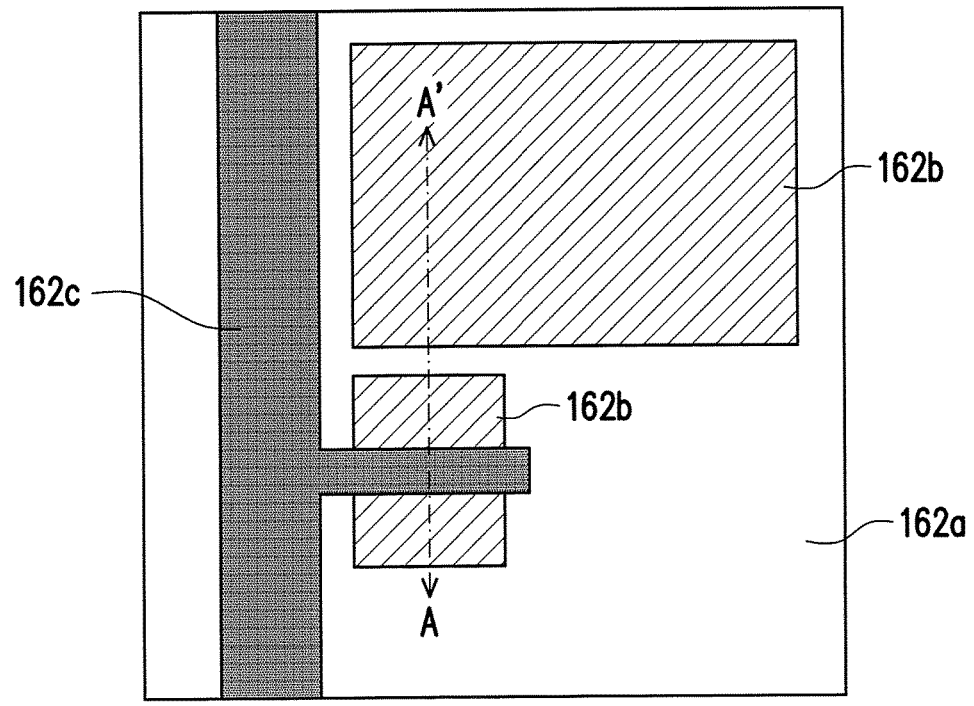
Figure 6B:
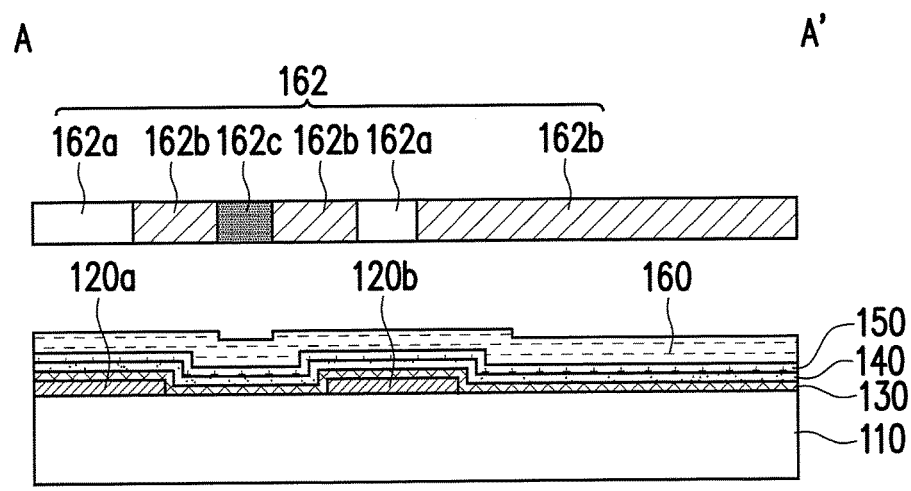

Referring to FIG. 6A and FIG. 6B, a photomask 162 is used to pattern the photoresist layer 160. The photomask 162 includes a first mask pattern 162a, a second mask pattern 162b, and a third mask pattern 162c with different transparencies. The transparency of the second mask pattern 162b is, for example, between the transparencies of the first mask pattern 162a and the third mask pattern 162c. In further detail, the first mask pattern 162a is, for example, completely transparent, the third mask pattern 162c is, for example, not transparent, and the second mask pattern 162b has a transparency between the first mask pattern 162a and the third mask pattern 162c. The photomask 162 may be a half-tone photomask or a gray-tone photomask. However, the invention is not limited thereto. Any suitable type of photomask to pattern the photoresist layer 160 can be utilized.

Figure 7A:
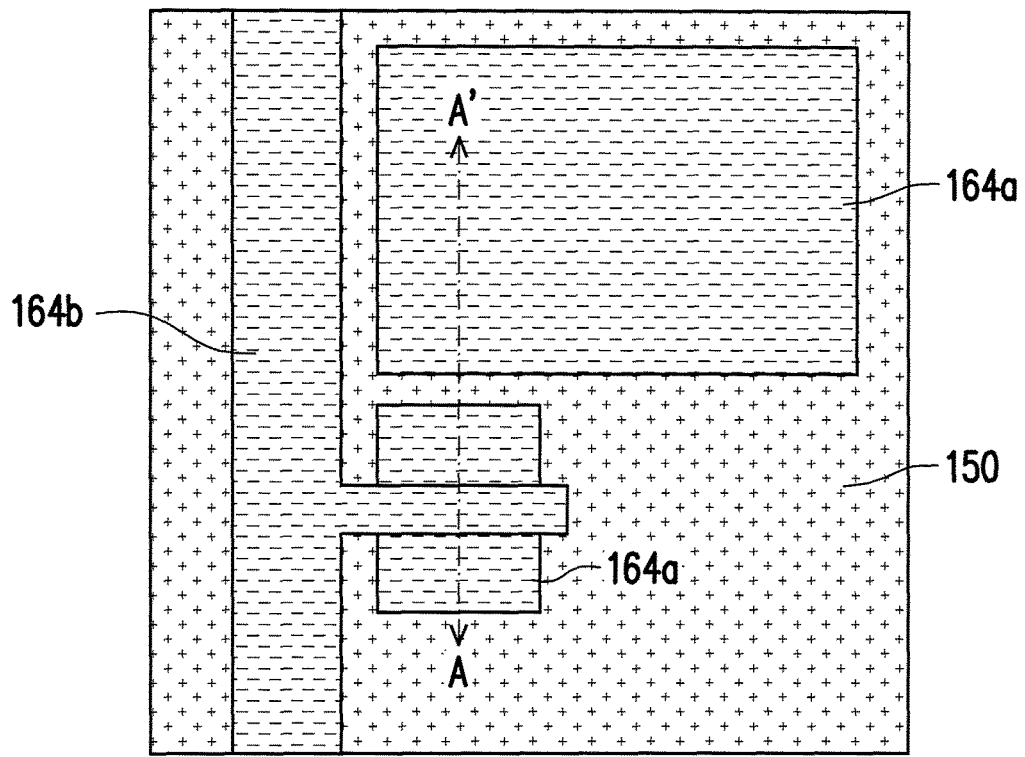
Figure 7B:
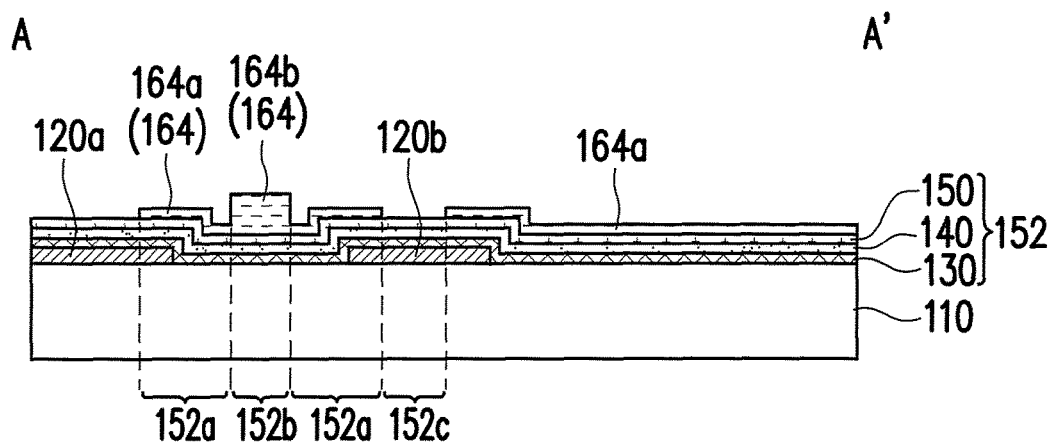

Referring to FIG. 7A and FIG. 7B, the photoresist layer 160 is patterned to form a patterned photoresist layer 164. The patterned photoresist layer 164 includes a first thickness portion 164a and a second thickness portion 164b. The first thickness portion 164a corresponds to the second mask pattern 162b of the photomask 162 and covers a first portion 152a of the stacked structure 152. The second thickness portion 164b corresponds to the third mask pattern 162c of the photomask 162 and covers a second portion 152b of the stacked structure 152. A third portion 152c of the stacked structure 152 is exposed by the patterned photoresist layer 164, wherein the third portion 152c of the stacked structure 152 corresponds to the first mask pattern 162a of the photomask 162. In the present embodiment, owing to transparency difference of the second mask pattern 162b and the third mask pattern 162c, the second thickness portion 164b is thicker than the first thickness portion 164a.

Figure 8A:
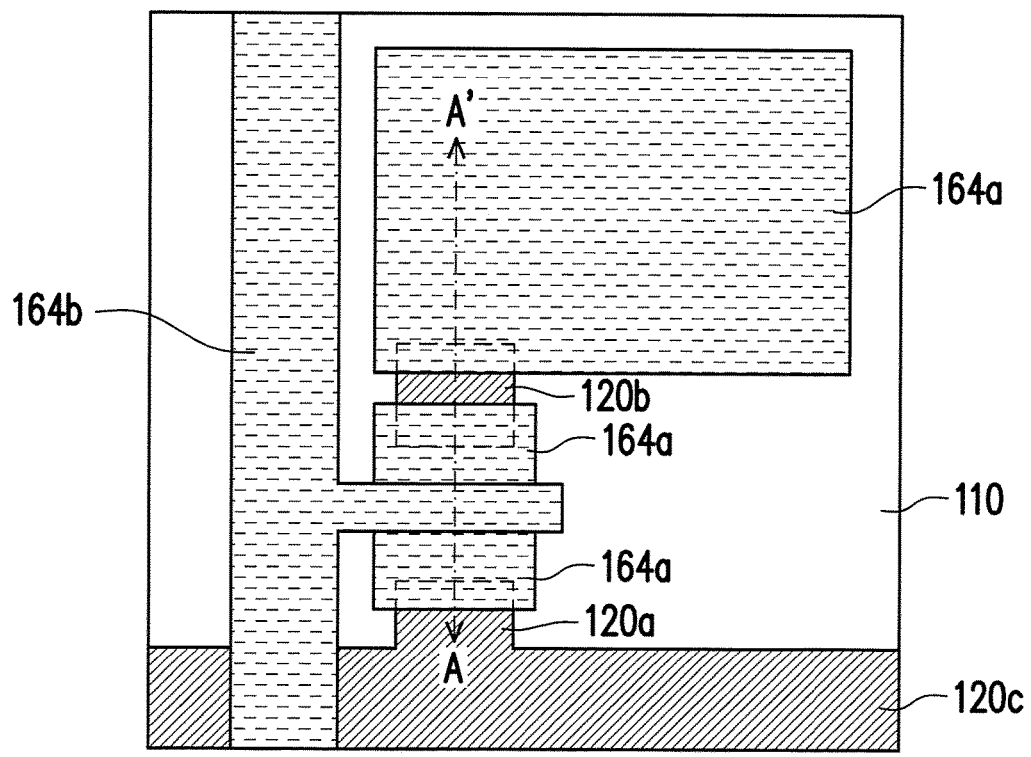
Figure 8B:
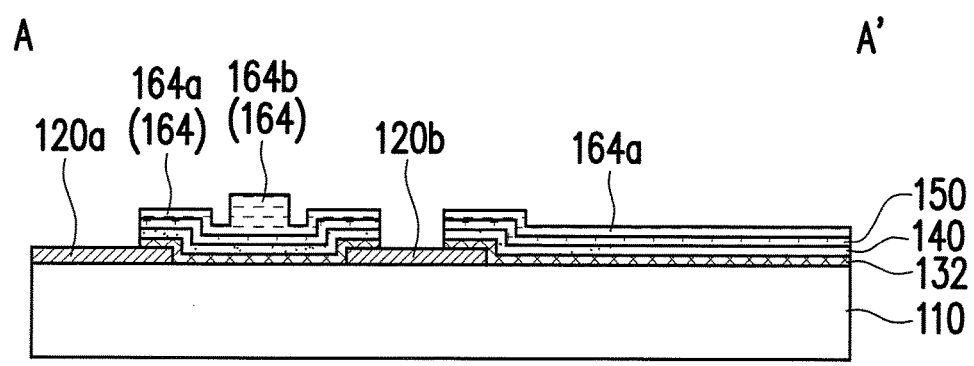

Referring to FIG. 8A and FIG. 8B, the third portion 152c of the stacked structure 152 is removed to pattern the patterned semiconductor material layer 130 into a patterned semiconductor layer 132 by using the patterned photoresist layer 164 as a mask. The patterned semiconductor layer 132 has the same shape as the first thickness portion 164a and the second thickness portion 164b of the patterned photoresist layer 164. The third portion 152c of the stacked structure 152 is removed by etching from the gate electrode material layer 150 until the patterned metal layer 120 is exposed. Thus, parts of the first metal portion 120a, the second metal portion 120b, and the data line 120c are exposed.

Figure 9A:
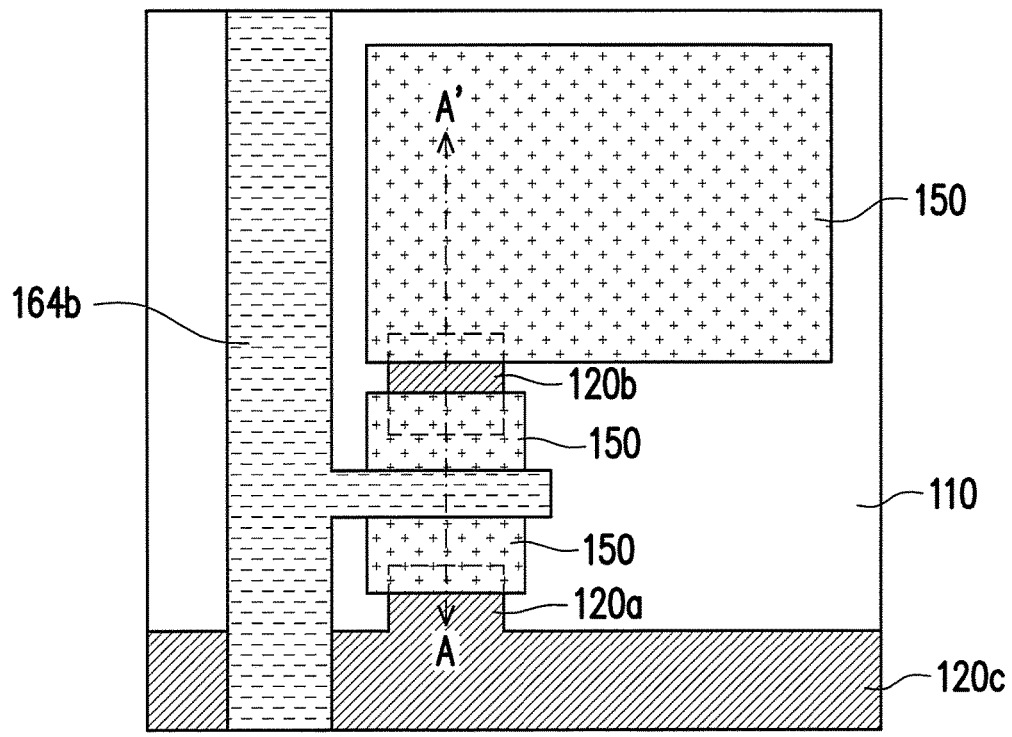
Figure 9B:
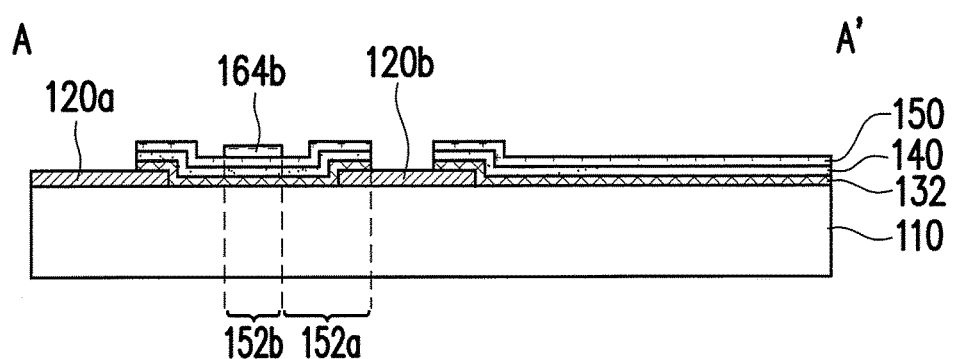

Referring to FIG. 9A and FIG. 9B, the first thickness portion 164a of the patterned photoresist layer 164 is then removed and the second thickness portion 164b of the patterned photoresist layer 164 is thinned to expose the first portion 152a of the stacked structure 152 previously covered by the first thickness portion 164a of the patterned photoresist layer 164. In the embodiment, an ashing process is performed to remove the first thickness portion 164a of the patterned photoresist layer 164 and thin the second thickness portion 164b of the patterned photoresist layer 164.

Figure 10A:
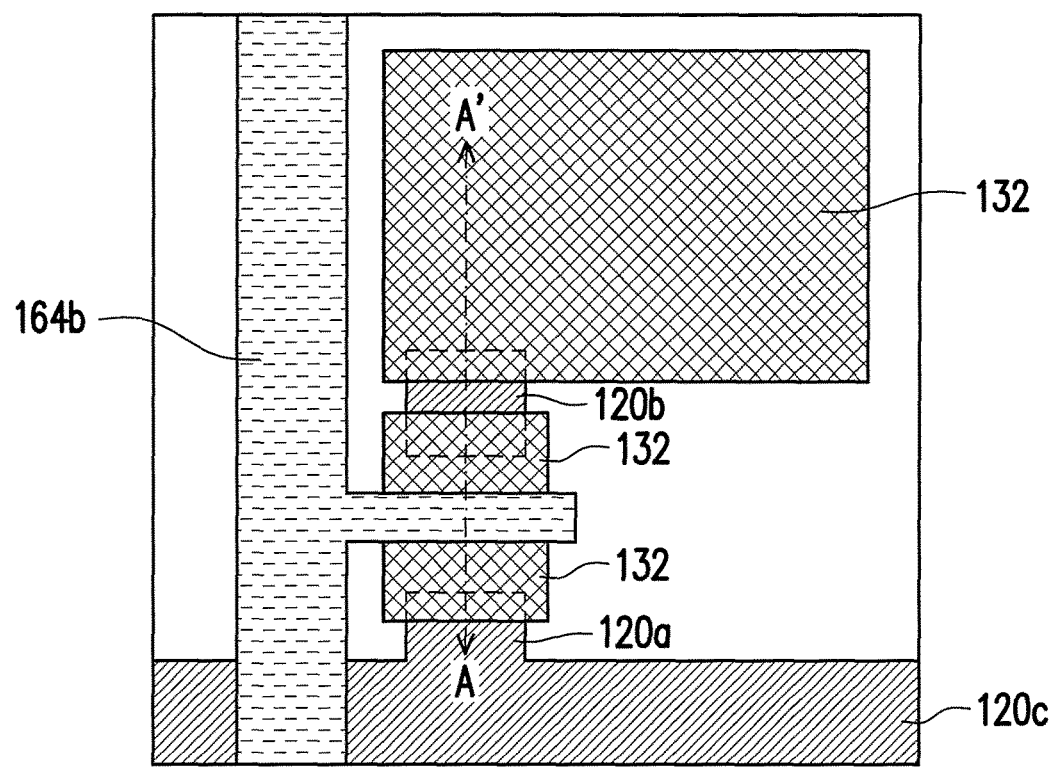
Figure 10B:
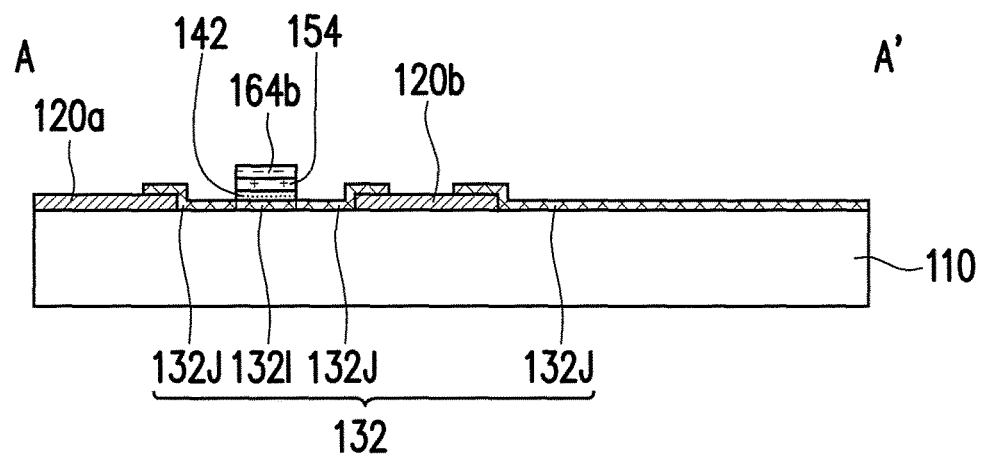

Referring to FIG. 10A and FIG. 10B, the first portion 152a of the stacked structure 152 is etched by using the thinned second thickness portion 164b of the patterned photoresist layer 164 as a mask until an exposed portion 132J of the patterned semiconductor layer 132 in the first portion 152a of the stacked structure 152 is exposed. The gate electrode material layer 150 is patterned into a gate electrode layer 154, and the insulation material layer 140 is patterned into an insulation layer 142 having a shape substantially conformal to the gate electrode layer 154 and covering a covered portion 132I of the patterned semiconductor layer 132.

Figure 11A:
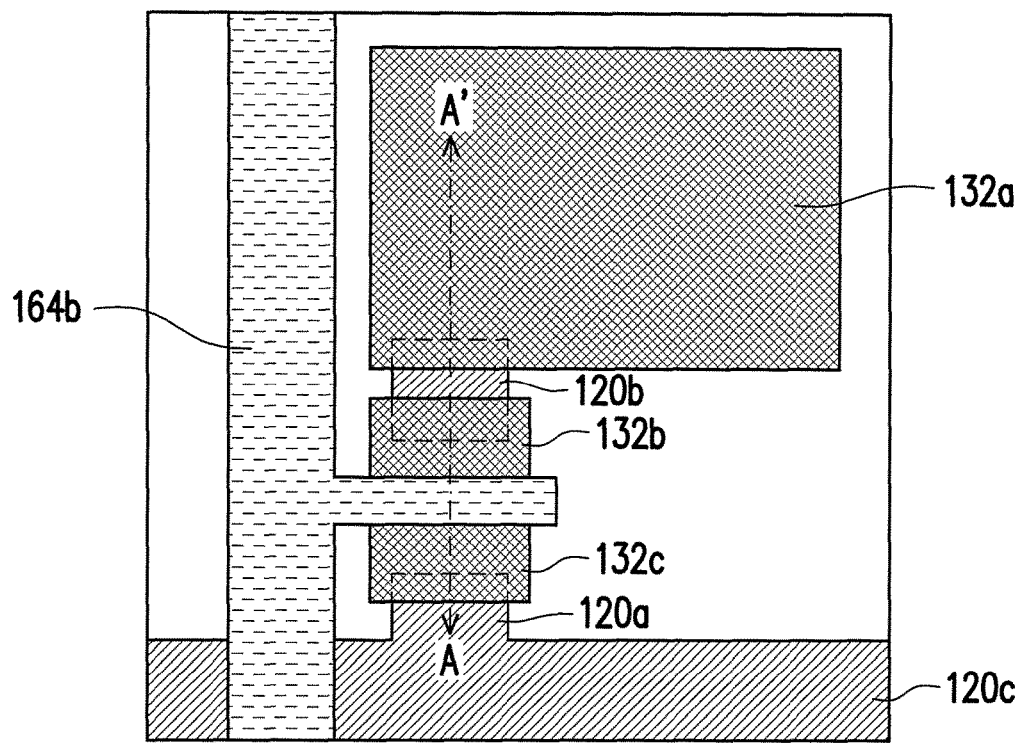
Figure 11B:
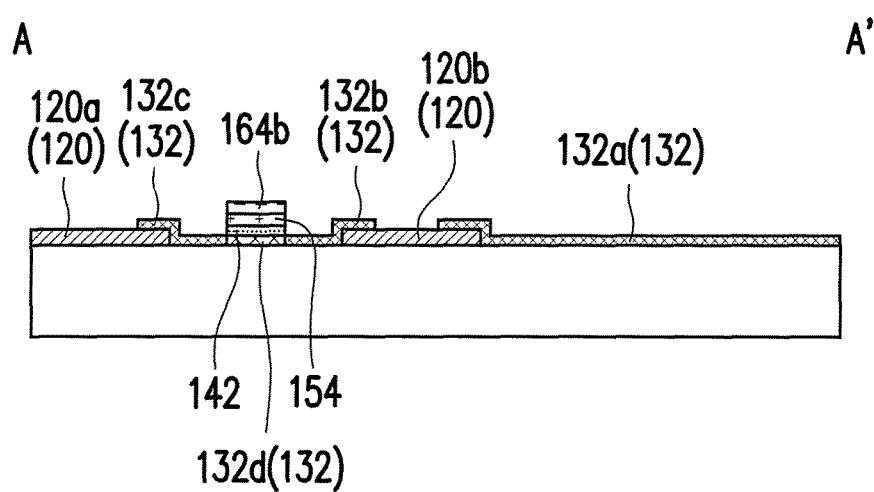

Referring to FIG. 11A and FIG. 11B, the exposed portion 132J of the patterned semiconductor layer 132 is then modified to increase a conductivity of the exposed portion 132J of the patterned semiconductor layer 132. The process for modifying the exposed portion 132J of the patterned semiconductor layer 132 includes performing a plasma treatment, an ion implanting, or a combination thereof. Particularly, in the plasma treatment, a processing gas includes hydrogen gas. However, the invention is not limited thereto. Other suitable method of modifying the exposed portion 132J of the patterned semiconductor layer 132 can be performed for increasing the conductivity of the exposed portion 132J of the patterned semiconductor layer 132.

By modifying the exposed portion 132J of the patterned semiconductor layer 132 by the insulation layer 142 to increase conductivity, the modified portion of the patterned semiconductor layer 132 includes and forms a pixel electrode 132a, a drain 132b, and a source 132c. The pixel electrode 132a is electrically connected to the drain 132b through the second metal portion 120b. That is to say the pixel electrode 132a is electrically connected to the second metal portion 120b, and the second metal portion 120b is electrically connected to the drain 132b.

In the embodiment, the pixel electrode 132a is formed simultaneously with the formation of the source 132c and the drain 132b by using the same film layer. In addition, the covered portion 132I of the patterned semiconductor layer 132, that was covered by the insulation layer 142 and not modified to increase conductivity, forms is a channel 132d.

Figure 12A:
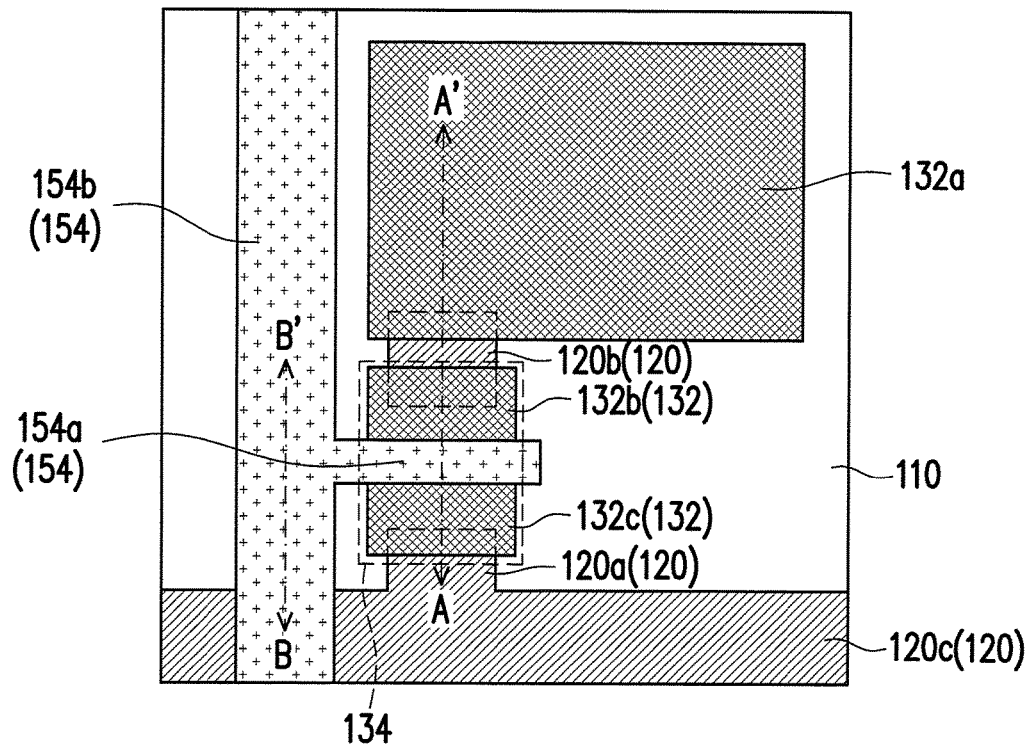
Figure 12B:
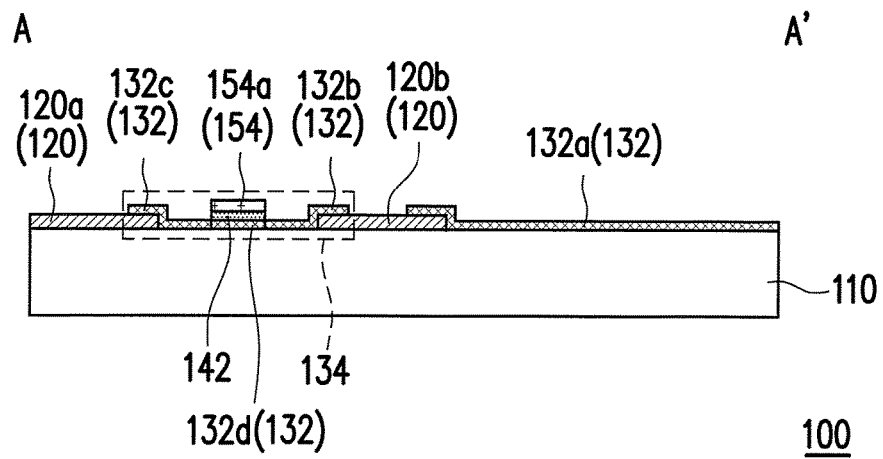

Referring to FIG. 12A and FIG. 12B, the thinned second thickness portion 164b of the patterned photoresist layer 164 is then removed. The process for removing the second thickness portion 164b includes performing a stripping process. However, the invention is not limited thereto. Other suitable method of removing the second thickness portion 164b can also be selected. After removing the second thickness portion 164b, the gate electrode layer 154 is exposed, and a pixel structure 100 of the embodiment is completely manufactured. In the present embodiment, the gate electrode layer 154 includes a gate 154a above the channel 132d, and a gate line 154b electrically connected to the gate 154a. The gate 154a, the channel 132d, the source 132c and the drain 132b form a thin film transistor structure 134. Based on the method described above, it can be seen that the thin film transistor structure 134 is self-aligned during formation, wherein the channel 132d and the gate 154a are defined by using the thinned second thickness portion 164b of the patterned photoresist layer 164. Thus, the thin film transistor structure 134 is a self-aligned thin film transistor structure. Particularly, in the present embodiment, the channel 132d, the source 132c, the drain 132b and the gate 154a are formed by using the same patterned photoresist layer 160 and the patterned photoresist layer 160 is formed by using one photomask. Therefore, the required amount of photomask for forming the thin film transistor structure 134 is reduced for saving the manufacture cost.

Figure 12C:
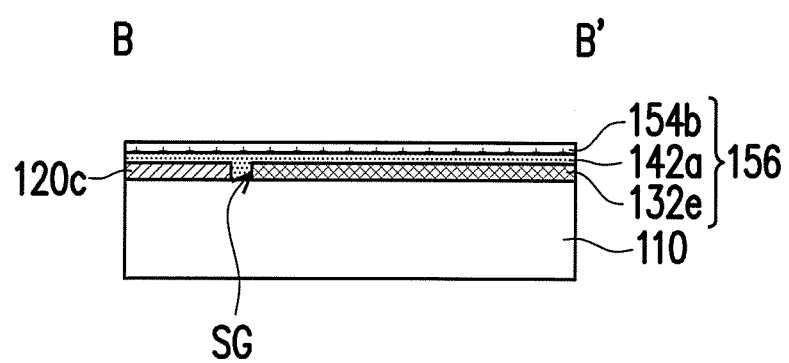
FIG. 12C is a schematic cross-sectional view taken along line B-B' in the corresponding FIG. 12A.

FIG. 12C is a schematic cross-sectional view taken along line B-B' in the corresponding FIG. 12A. Referring to FIG. 12A, FIG. 12B, and FIG. 12C, the pixel structure 100 includes the pixel electrode 132a disposed on a substrate 110, the thin film transistor structure 134, and the insulation layer 142. The thin film transistor structure 134 is disposed on the substrate 110 and connected to the pixel electrode 132a. The thin film transistor structure 134 includes the source 132c, the drain 132b and the channel 132d formed by the same patterned semiconductor layer 132 and the gate 154a formed by the gate electrode layer 154. The source 132c and the drain 132b are located at two opposite sides of the channel 132d, and the gate 154a is located above the channel 132d. The insulation layer 142 is interposed between the patterned semiconductor layer 132 and the gate electrode layer 154 and has a shape substantially conformal to the gate electrode layer 154. The insulation layer 142 covers a portion of the patterned semiconductor layer 132 to form the channel 132d and exposes another portion of the patterned semiconductor layer 132 to form the source 132c and the drain 132b.

According to the step depicted in FIG. 11A and FIG. 11B, the covered portion 132I of the patterned semiconductor layer 132 has a first conductivity type and the exposed portion 132J of the patterned semiconductor layer 132 has a second conductivity type more conductive than the first conductivity type. Therefore, the exposed portion 132J of the patterned semiconductor layer 132 can form the source 132c, the drain 132b and the pixel electrode 132a which are the elements predetermined to be electrically conductive.

For transmitting the electric signals, the pixel structure 100 further includes the data line 120c disposed on the substrate 110, and electrically connected to the source 132c of the thin film transistor structure 134, wherein the first metal portion 120a of the data line 120c is located between the semiconductor layer 132 and the substrate 110. In addition, the gate electrode layer 154 further includes the gate line 154b electrically connected to the gate 154a of the thin film transistor structure 134. The gate line 154b and the data line 120c extends in different directions for respectively transmitting a control signal to the gate 154a and transmitting a data signal to the source 132c. Therefore, the thin film transistor structure 134 can be turned on by the control signal and the data signal can be transmitted to the pixel electrode 132a through the turned-on thin film transistor structure 134.

In the present embodiment, the gate line 154b is formed by using the same method of forming the gate 154a. Therefore, the insulation layer 142 includes an insulation portion 142a underlying the gate line 154b. The insulation portion 142a conforms in shape to the gate line 154b. The patterned semiconductor layer 132 further includes a semiconductor portion 132e underlying the gate line 154b and has a separating gap SG corresponding to the opening 130A shown in FIG. 2A and exposing a portion of the data line 120c. The semiconductor portion 132e partially conforms in shape to the gate line 154b. The gate line 154b, the insulation portion 142a and the semiconductor portion 132e form a gate line structure 156, where the gate line 154b and the insulation portion 142a of the gate line structure 156 cross over the data line 120c at the separating gap SG such that the semiconductor portion 132e is not in contact with the data line 120c and the insulation portion 142a of the insulation layer 142 fills in the separating gap SG and contacts the data line 120c for isolating the data line 120c from the gate line 154b. In other words, the semiconductor portion 132e of the gate line structure 156 is electrically insulating to the data line 120c so that a short circuit would not generate between the semiconductor portion 132e and the data line 120c.

In the embodiment, a portion of the source 132c is in direct contact with the data line 120c by being in direct contact with the first metal portion 120a that branches off of the data line 120c, to electrically connect to the data line 120c. In addition, the pixel structure 100 further includes the second metal portion 120b disposed on the substrate 110, located and electrically connected between the drain 132b and the pixel electrode 132a. A material of the second metal portion 120b and the data line 120c is the same. However, in an alternative embodiment, the first metal portion 120a and the second metal portion 120b can be selectively omitted.

FIG. 13A to FIG. 24A are schematic top views illustrating the manufacture process of a pixel structure according to another embodiment of the invention. FIG. 13B to FIG. 24B are schematic cross-sectional views respectively taken along line A-A' in the corresponding FIG. 13A to FIG. 24A. It should be noted that in FIG. 13A to FIG. 24A, if a boundary of a layer substantially overlaps with another layer, the schematic top views only label the top most layer. Thus, FIG. 13A to FIG. 24A have omitted the references for some of the components. Please refer to the corresponding schematic cross-sectional views (i.e., FIG. 13B to FIG. 24B) at the same time. The following uses FIG. 13A to FIG. 24A and FIG. 13B to FIG. 24B to describe the manufacturing process of the pixel structure of another embodiment of the invention.

The difference between the embodiment of FIG. 13A to FIG. 24A, FIG. 13B to FIG. 24B, and FIG. 24C and the embodiment of FIG. 1A to FIG. 12A, FIG. 1B to FIG. 12B, and FIG. 12C, is that the second metal portion 120b is not included in the embodiment of FIG. 13A to FIG. 24A, FIG. 13B to FIG. 24B, and FIG. 24C. Similar elements will use the same names, and processes that are the same both embodiments will not be repeated herein. The materials used are also similar in both embodiments, and the description will not be repeated herein.

Figure 13A:
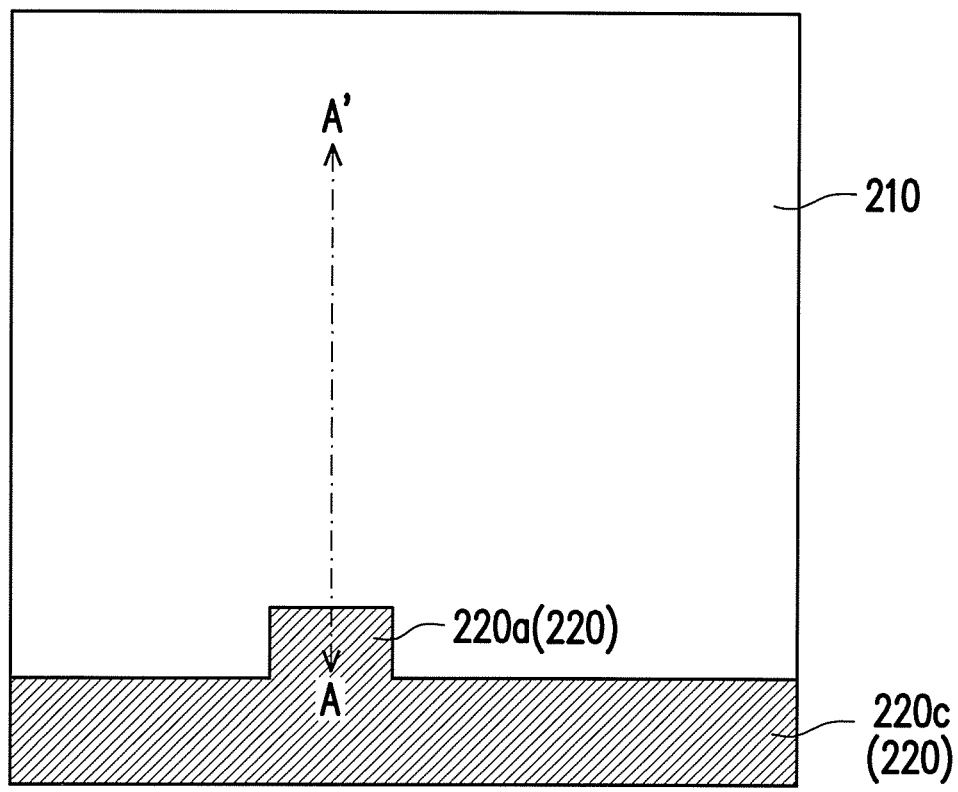
Figure 13B:
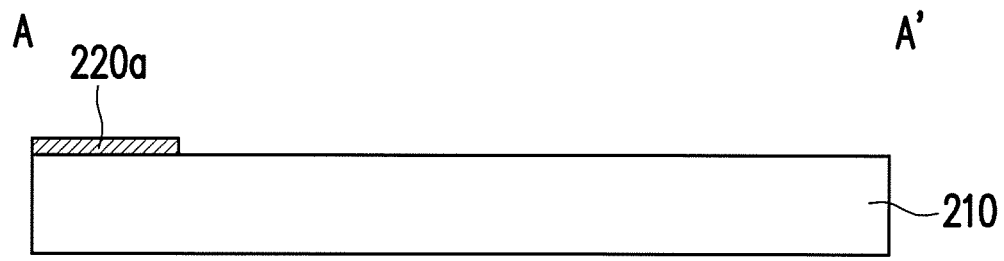

Referring to FIG. 13A and FIG. 13B, a metal layer (not shown) is first formed on a substrate 210. Next, the metal layer is patterned to form a patterned metal layer 220 on the substrate 210. The patterned metal layer includes a first metal portion 220a and a data line 220c. The first metal portion 220a branches off of the data line 220c.

Figure 14A:
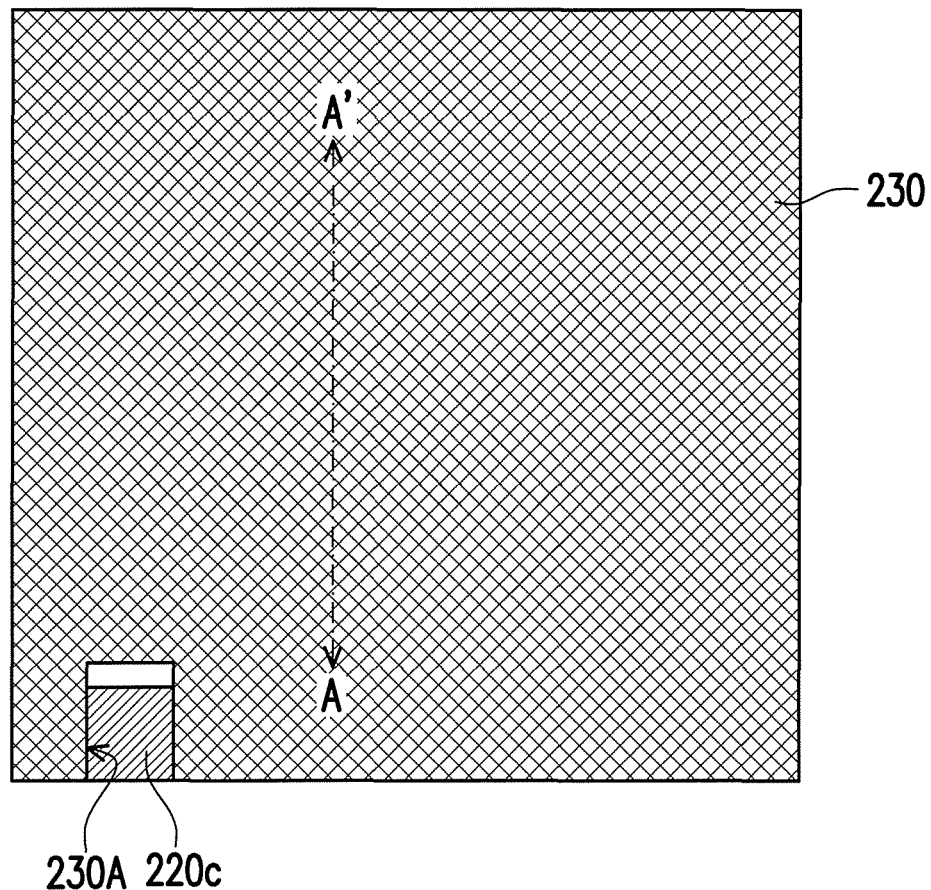
Figure 14B:
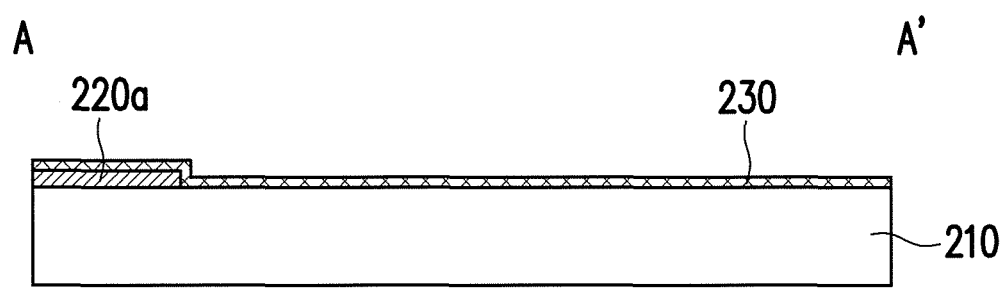
Figure 15A:
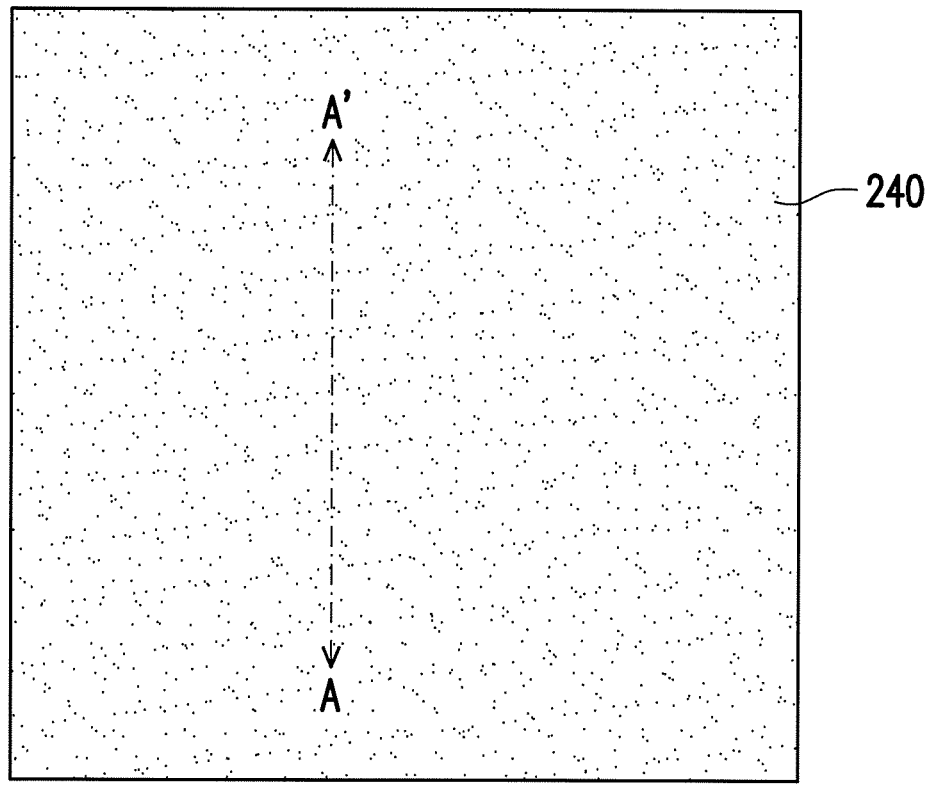
Figure 15B:
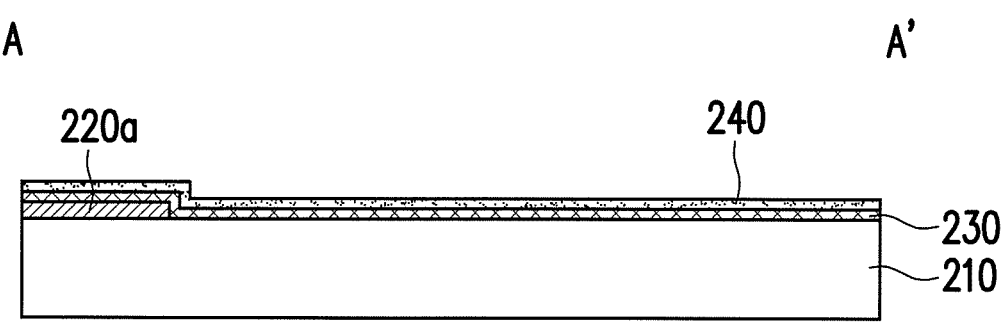
Figure 16A:
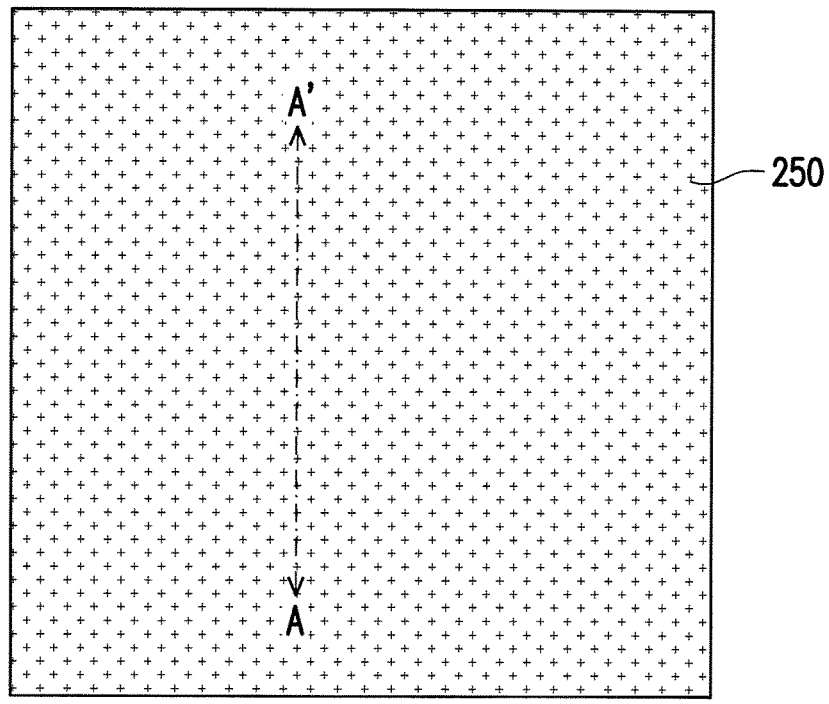
Figure 16B:
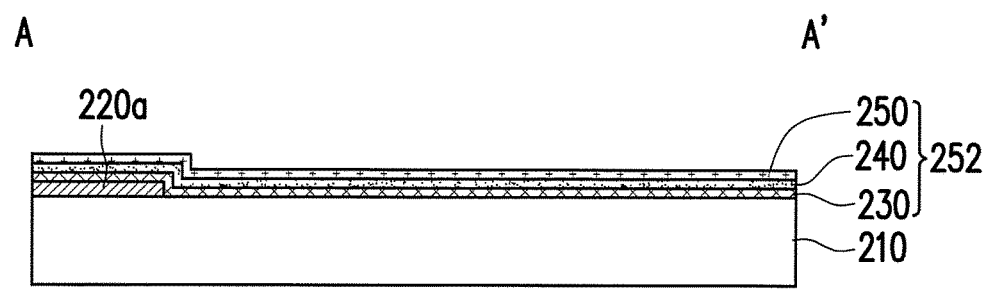

Referring to FIG. 14A and FIG. 14B, a patterned semiconductor material layer 230 is formed on the substrate 210. Particularly, the patterned semiconductor material layer 230 has an opening 230A exposing a portion of the data line 220c. Referring to FIG. 15A and FIG. 15B, an insulation material layer 240 is formed on the patterned semiconductor material layer 230. Referring to FIG. 16A and FIG. 16B, a gate electrode material layer 250 is formed on the insulation material layer 240. Thus, it can be seen that the patterned semiconductor material layer 230, the insulation material layer 240, and the gate electrode material layer 250 are formed in sequence on the substrate 210 to form a stacked structure 252.

Figure 17A:
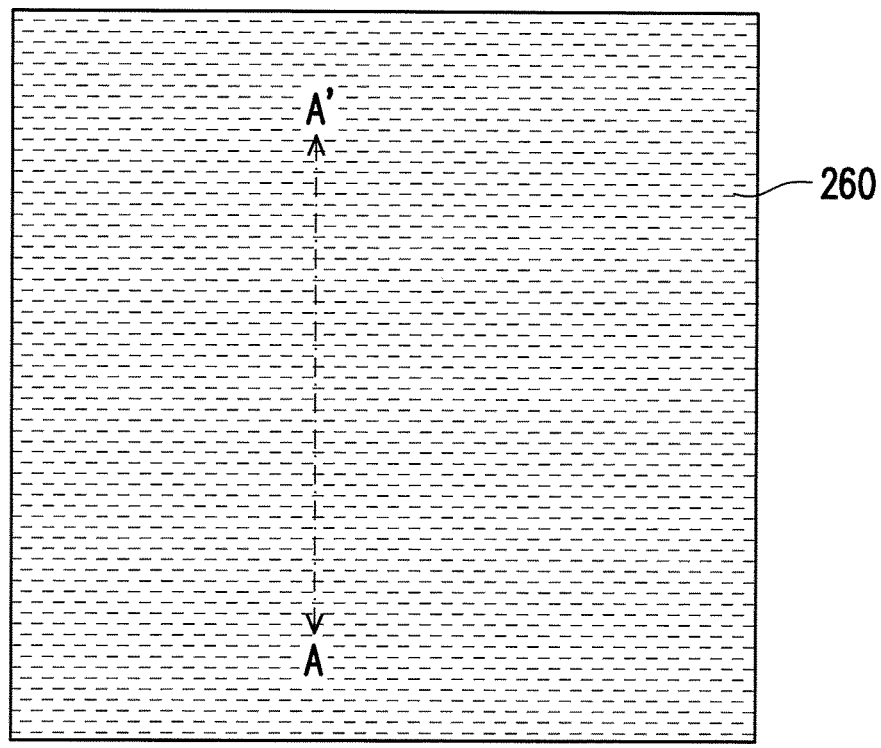
Figure 17B:
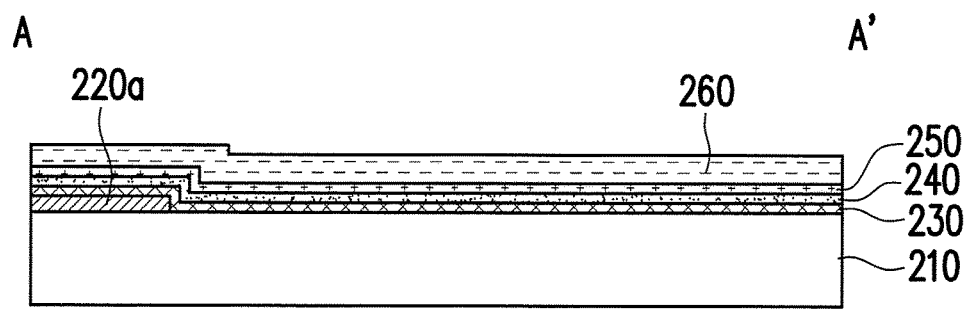
Figure 18A:
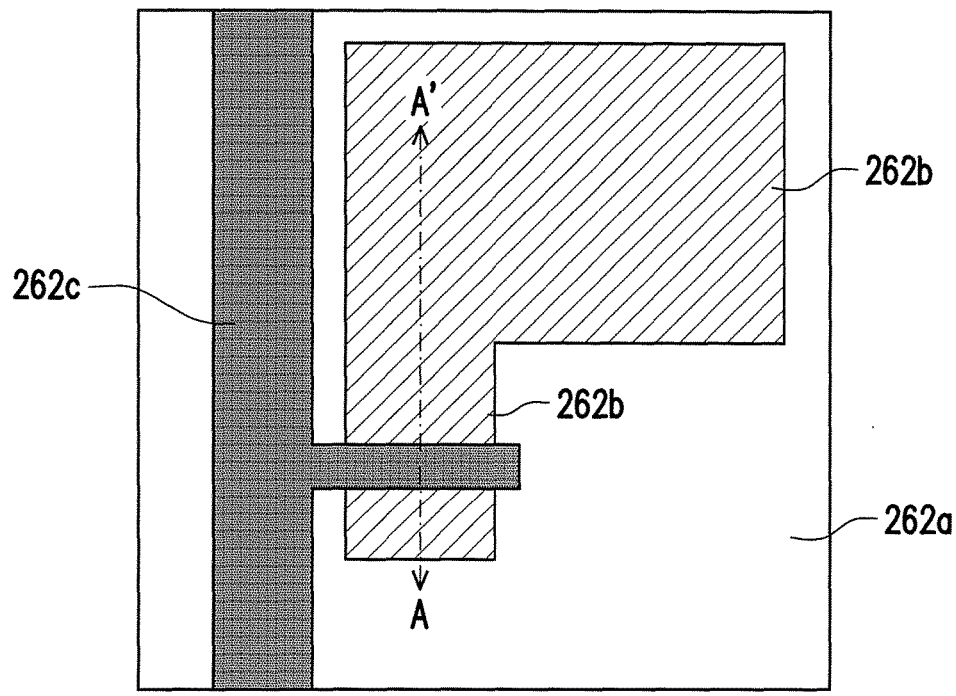
Figure 18B:
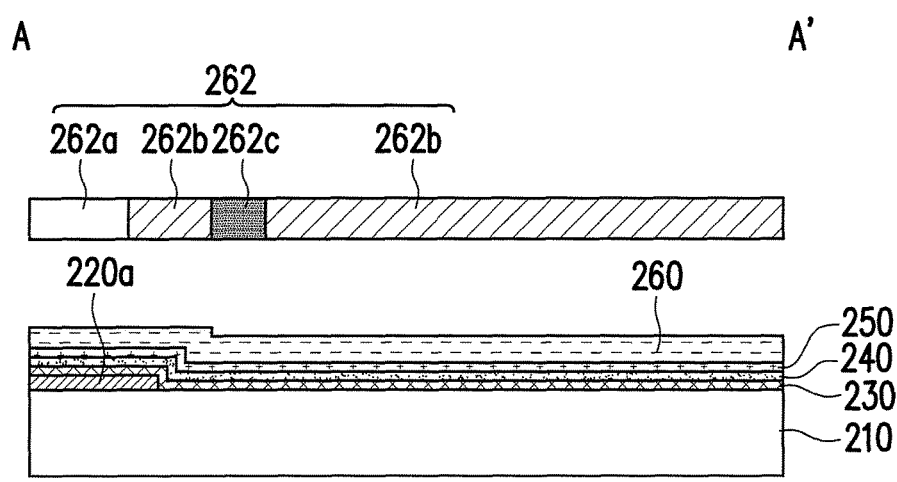

Referring to FIG. 17A and FIG. 17B, a photoresist layer 260 is formed on the gate electrode material layer 250 by using a photosensitive material. Referring to FIG. 18A and FIG. 18B, a photomask 262 is used to pattern the photoresist layer 260. The photomask 262 includes a first mask pattern 262a, a second mask pattern 262b, and a third mask pattern 262c with different transparencies. The description of the photomask 262 is similar to the photomask 162, and will not be repeated herein.

Figure 19A:
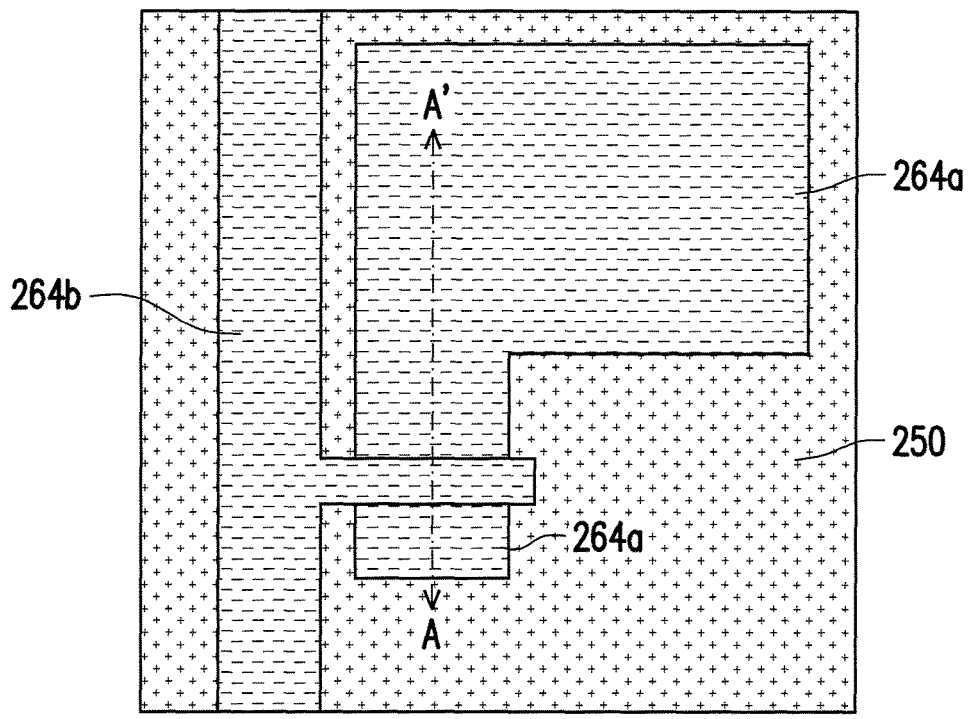
Figure 19B:
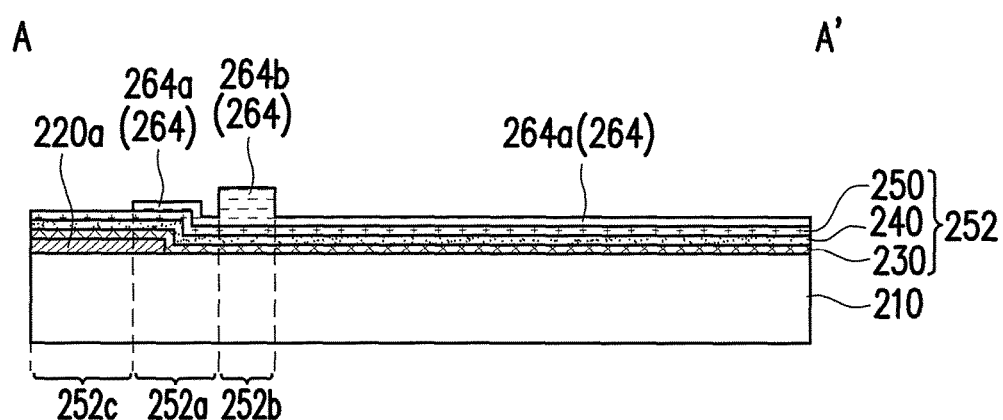

Referring to FIG. 19A and FIG. 19B, the photoresist layer 260 is patterned to form a patterned photoresist layer 264. The patterned photoresist layer 264 includes a first thickness portion 264a and a second thickness portion 264b. The first thickness portion 264a corresponds to the second mask pattern 262b of the photomask 262 and covers a first portion 252a of the stacked structure 252. The second thickness portion 264b corresponds to the third mask pattern 262c of the photomask 262 and covers a second portion 252b of the stacked structure 252. A third portion 252c of the stacked structure 252 is exposed by the patterned photoresist layer 264. The third portion 252c of the stacked structure 252 that is exposed by the patterned photoresist layer 264 corresponds to the first mask pattern 262a of the photomask 262. In the present embodiment, owing to transparency difference of the second mask pattern 262b and the third mask pattern 262c, the second thickness portion 264b is thicker than the first thickness portion 264a.

Figure 20A:
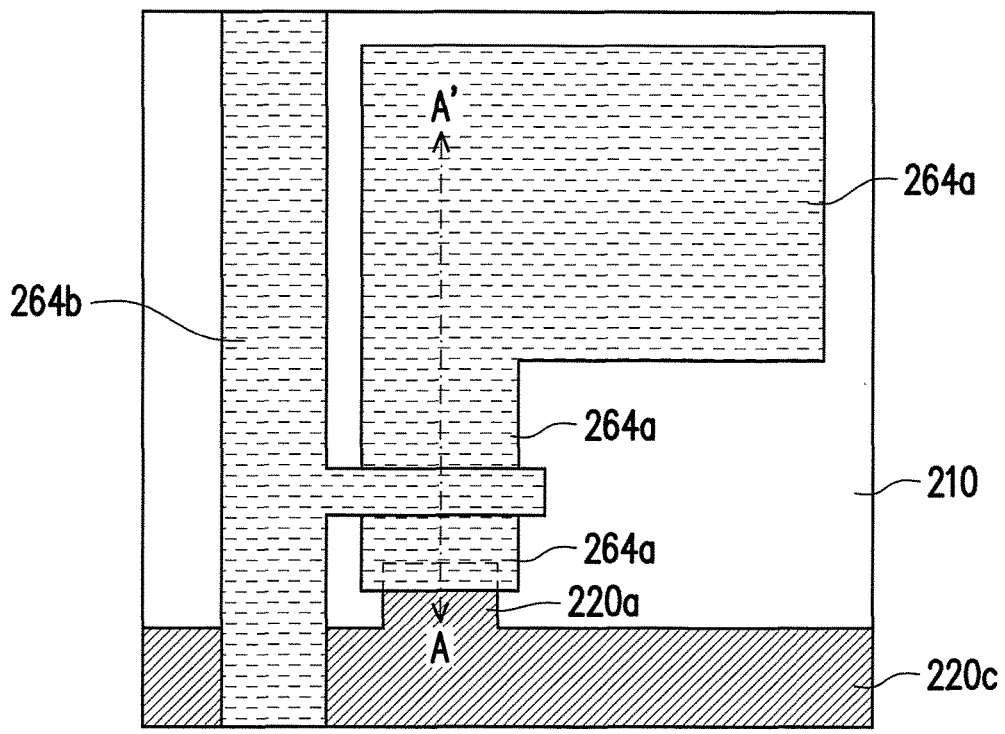
Figure 20B:
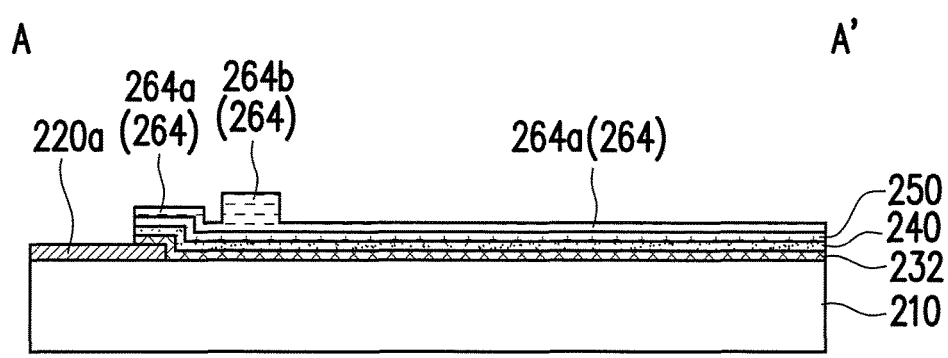

Referring to FIG. 20A and FIG. 20B, the third portion 252c of the stacked structure 252 is removed to pattern the patterned semiconductor material layer 230 into a patterned semiconductor layer 232 by using the patterned photoresist layer 264 as a mask. The patterned semiconductor layer 232 has the same shape as the first thickness portion 264a and the second thickness portion 264b of the patterned photoresist layer 264 in the top view as shown in FIG. 20A. The third portion 252c of the stacked structure 252 is removed by etching from the gate electrode material layer 250 until the patterned metal layer 220 is exposed. Thus, parts of the first metal portion 220a and the data line 220c are exposed.

Figure 21A:
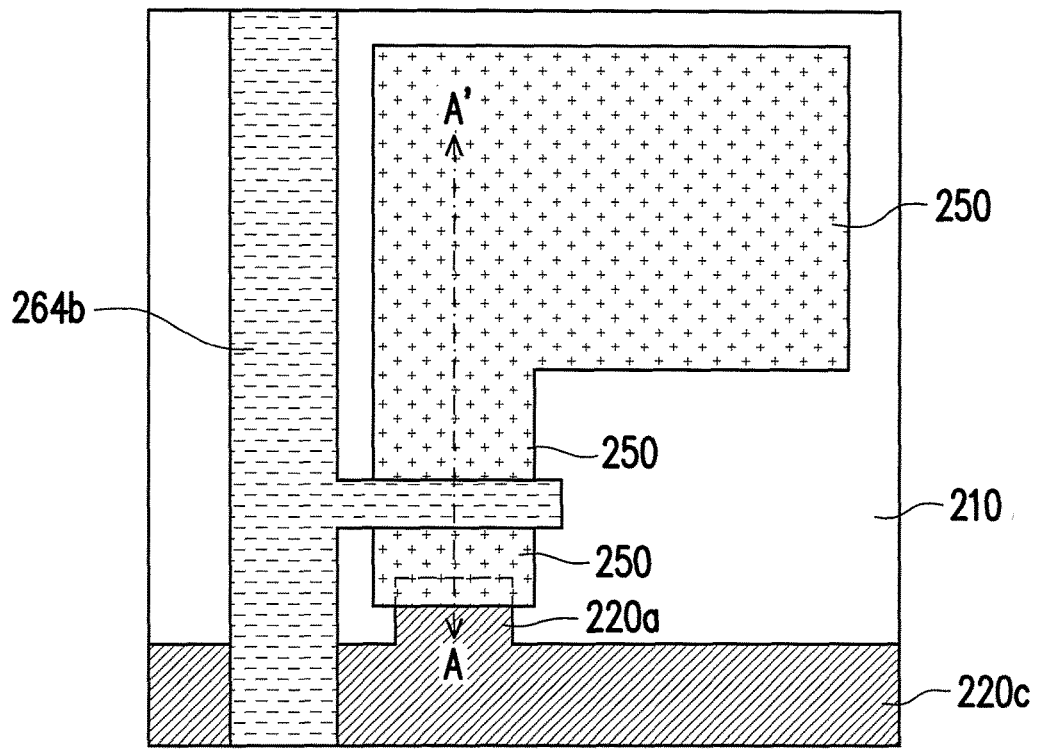
Figure 21B:
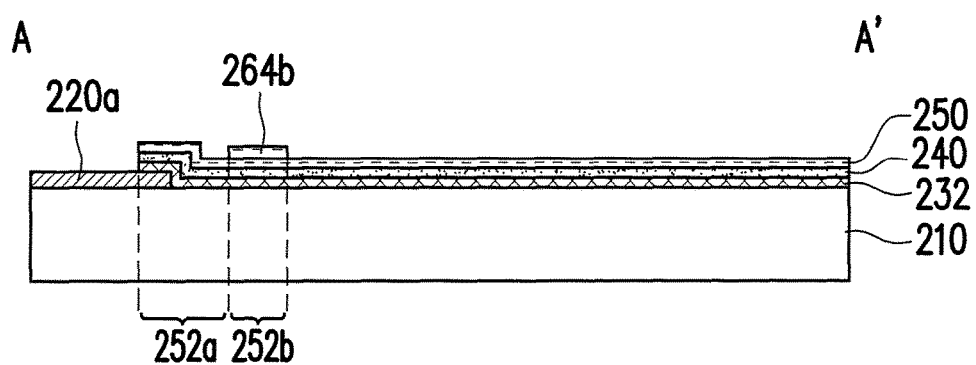

Referring to FIG. 21A and FIG. 21B, the first thickness portion 264a of the patterned photoresist layer 264 is then removed and the second thickness portion 264b of the patterned photoresist layer 264 is thinned to expose the first portion 252a of the stacked structure 252 previously covered by the first thickness portion 264a of the patterned photoresist layer 264. In the embodiment, an ashing process is performed to remove the first thickness portion 264a of the patterned photoresist layer 264 and thin of the second thickness portion 264b of the patterned photoresist layer 264.

Figure 22A:
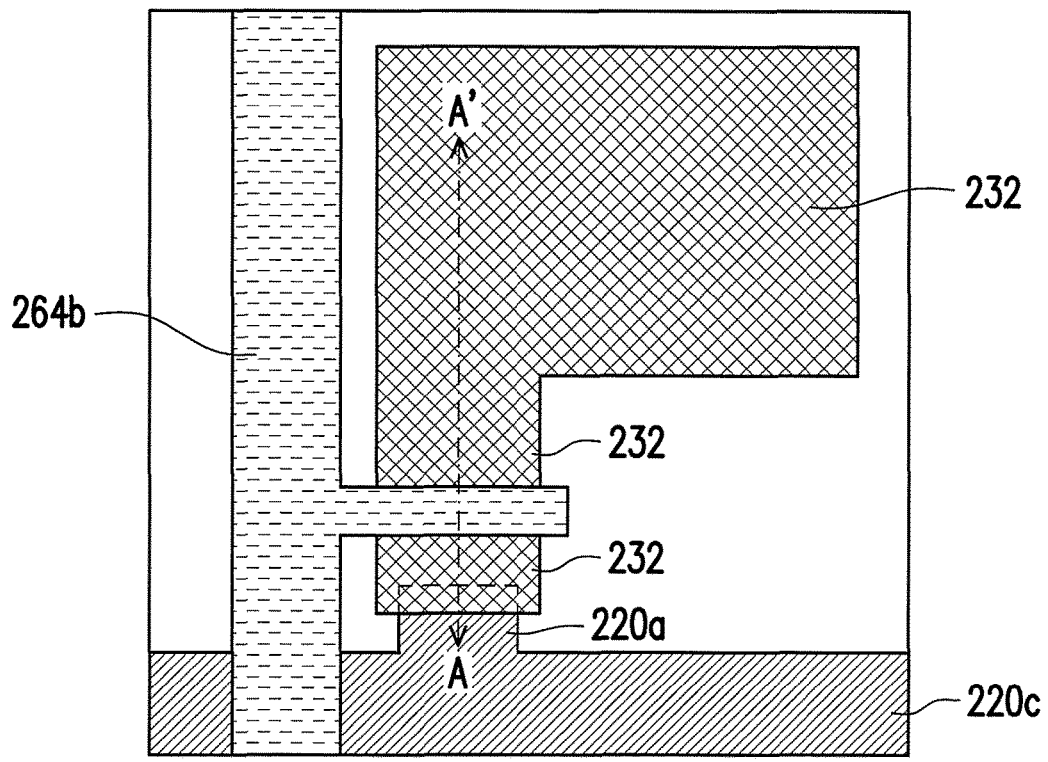
Figure 22B:
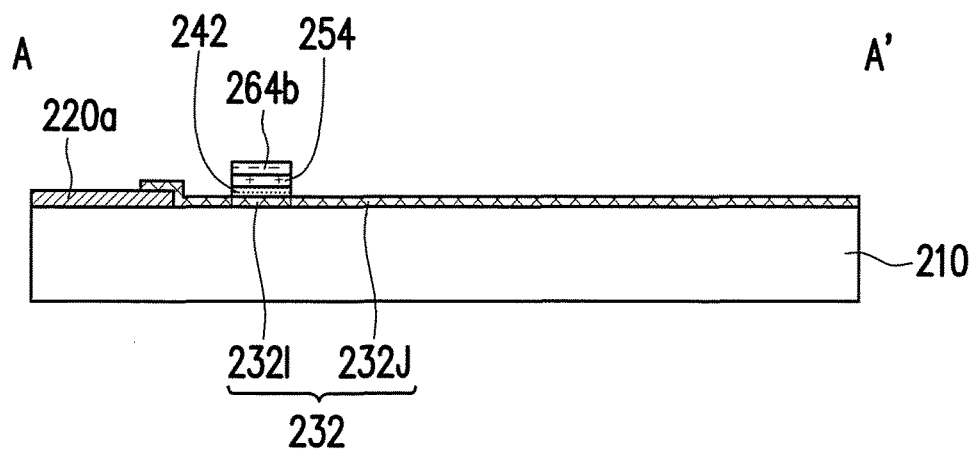

Referring to FIG. 22A and FIG. 22B, the first portion 252a of the stacked structure 252 is etched by using the thinned second thickness portion 264b of the patterned photoresist layer 264 as a mask until an exposed portion 232J of the patterned semiconductor layer 232 in the first portion 252a of the stacked structure 252 is exposed. The gate electrode material layer 250 is patterned into a gate electrode layer 254, and the insulation material layer 240 is patterned into an insulation layer 242 having a shape substantially conformal to the gate electrode layer 254 and covering a covered portion 232I of the patterned semiconductor layer 232.

Figure 23A:
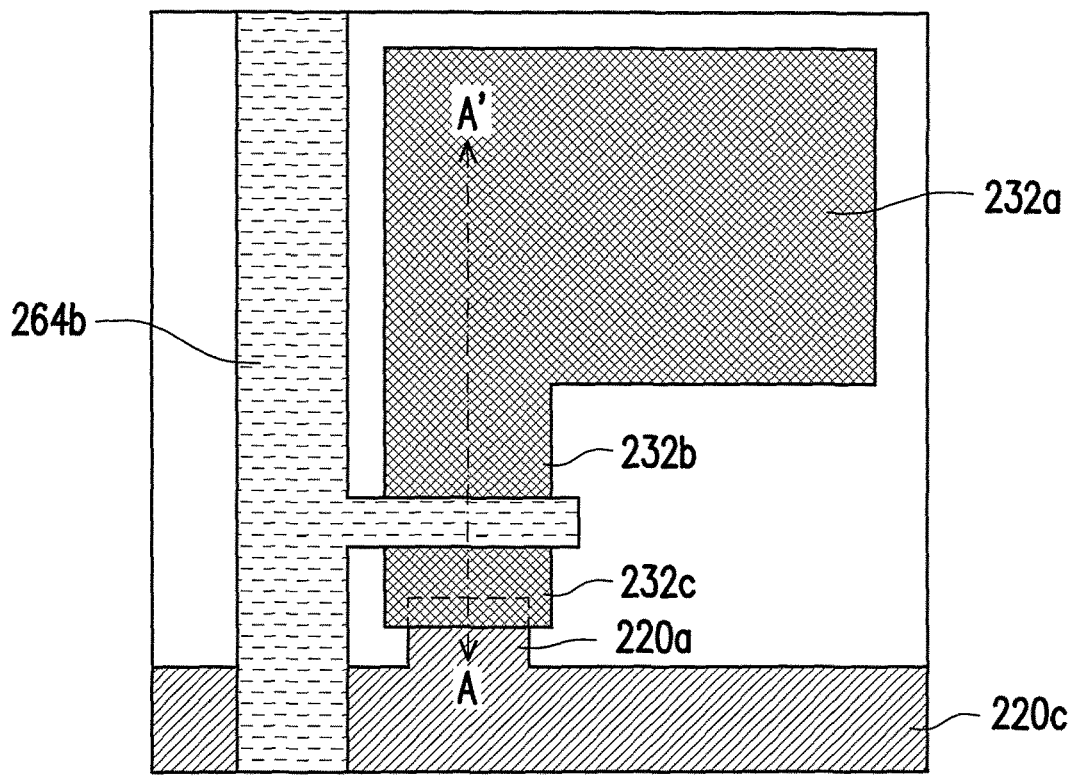
Figure 23B:
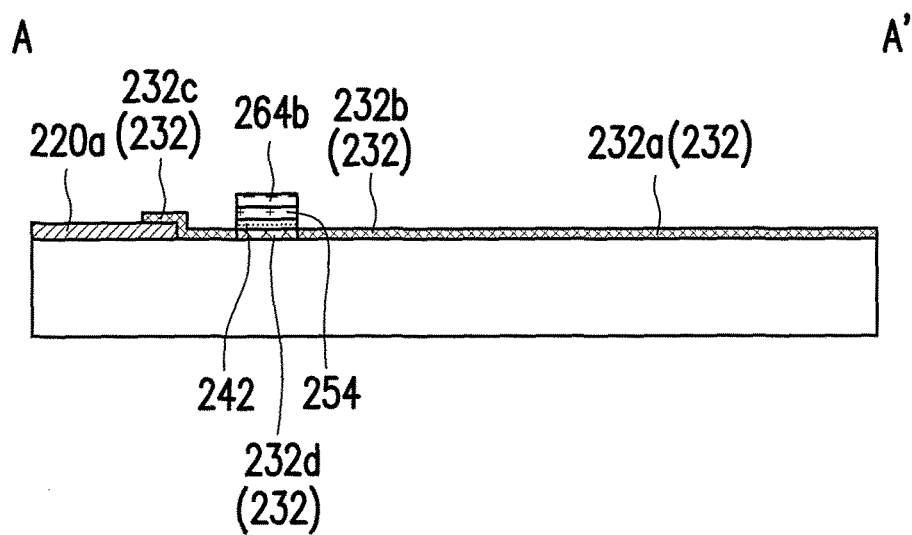

Referring to FIG. 23A and FIG. 23B, the exposed portion 232J of the patterned semiconductor layer 232 is then modified to increase a conductivity of the exposed portion 232J of the patterned semiconductor layer 232. This step is similar to the description of the step in FIG. 11A and FIG. 11B, and will not be repeated herein.

By modifying the exposed portion 232J of the patterned semiconductor layer 232 exposed by the insulation layer 242 to increase conductivity, the modified exposed portion 232J of the patterned semiconductor layer 232 includes and forms a pixel electrode 232a, a drain 232b, and a source 232c. The pixel electrode 232a is electrically connected to the drain 232b. In the embodiment, there is no a metal portion to electrically connect the pixel electrode 232a and the drain 232b. Rather, the pixel electrode 232a and the drain 232b are of the same patterned semiconductor layer 232, and branch off of each other to be in direct contact and electrically connected.

In the embodiment, the pixel electrode 232a is formed simultaneously with the formation of the source 232c and the drain 232b by using the same film layer. In addition, the covered portion 232I of the patterned semiconductor layer 232 covered by the insulation layer 242 that was not modified to increase conductivity forms a channel 232d. Accordingly, in the present embodiment, the pixel electrode 232a, the source 232c, the drain 232b and the channel 232d can be formed by using the same film layer, the patterned semiconductor material layer 230.

Figure 24A:
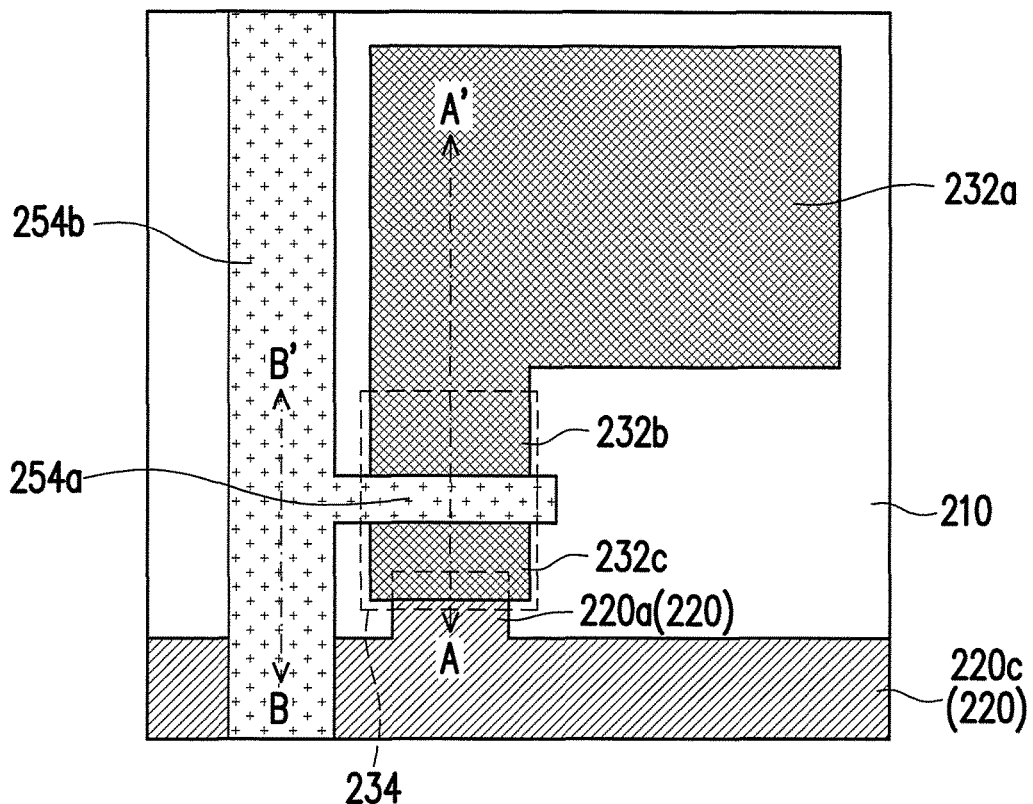
Figure 24B:
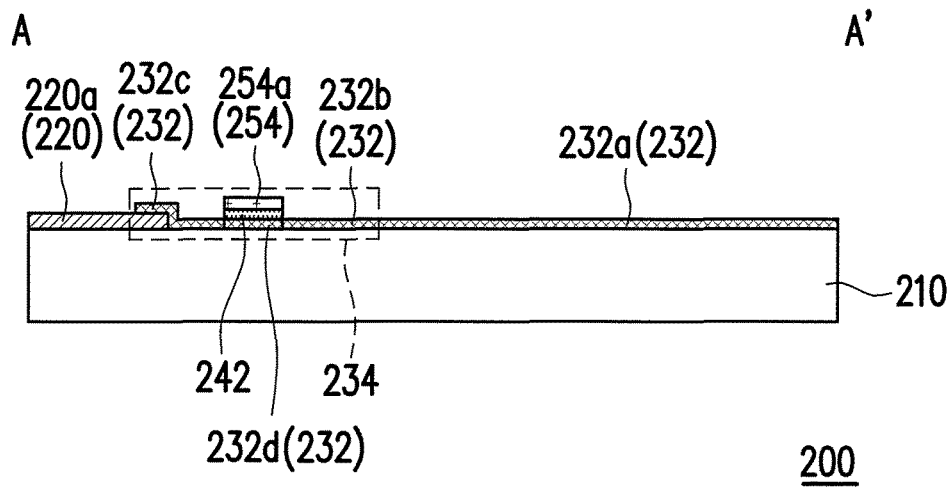

Referring to FIG. 24A and FIG. 24B, the thinned second thickness portion 264b of the patterned photoresist layer 264 is then removed. The process for removing the second thickness portion 264b includes performing a stripping process. However, the invention is not limited thereto. Any suitable method of removing the second thickness portion 264b can be used. After removing the second thickness portion 264b, the gate electrode layer 254 is exposed, and a pixel structure 200 of the embodiment is completely manufactured. In the present embodiment, the gate electrode layer 254 includes a gate 254a above the channel 232d, and a gate line 254b electrically connected to the gate 254a. The gate 254a, the channel 232d, the source 232c and the drain 232b form a thin film transistor structure 234. Based on the method described above, it can be seen that the thin film transistor structure 234 is self-aligned during formation, wherein the channel 232d and the gate 254a are defined by using the thinned second thickness portion 264b of the patterned photoresist layer 264. Thus, the thin film transistor structure 234 is a self-aligned thin film transistor structure. Particularly, in the present embodiment, the channel 232d, the source 232c, the drain 232b and the gate 254a are formed by using the same patterned photoresist layer 260 and the patterned photoresist layer 260 is formed by using one photomask. Therefore, the required amount of photomask for forming the thin film transistor structure 234 is reduced for saving the manufacture cost.

Figure 24C:
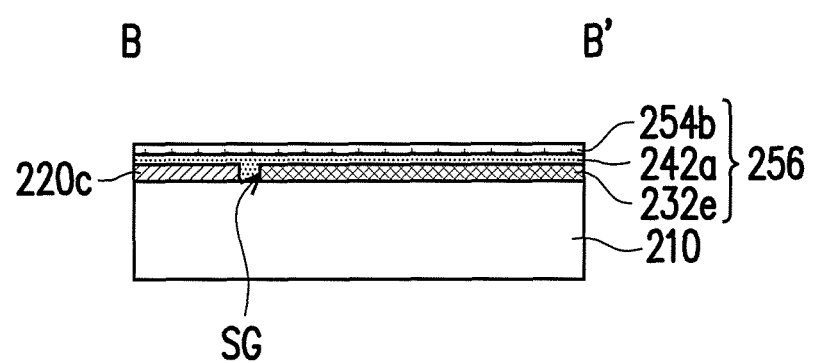
FIG. 24C is a schematic cross-sectional view taken along line B-B' in the corresponding FIG. 24A.

FIG. 24C is a schematic cross-sectional view taken along line B-B' in the corresponding FIG. 24A. Referring to FIG. 24A, FIG. 24B, and FIG. 24C, the pixel structure 200 includes the pixel electrode 232a disposed on the substrate 210, the thin film transistor structure 234, and the insulation layer 242. The thin film transistor structure 234 is disposed on the substrate 210 and connected to the pixel electrode 232a. The thin film transistor structure 234 includes the source 232c, the drain 232b and the channel 232d formed by a patterned semiconductor layer 232 and a gate 254a formed by a gate electrode layer 254. The source 232c and the drain 232b are located on two opposite sides of the channel 232d, and the gate 254a is located above the channel 232d. The insulation layer 242 is interposed between the patterned semiconductor layer 232 and the gate electrode layer 254 and has a shape substantially conformal to the gate electrode layer 254. The insulation layer 242 covers a portion of the patterned semiconductor layer 232 to form the channel 232d and exposes another portion of the patterned semiconductor layer 232 to form the source 232c and the drain 232b.

According to the step depicted in FIG. 23A and FIG. 23B, the covered portion 232I of the patterned semiconductor layer 232 has a first conductivity type and the exposed portion 232J of the patterned semiconductor layer 232 has a second conductivity type more conductive than the first conductivity type. Therefore, the exposed portion 232J of the patterned semiconductor layer 232 can from the source 232c, the drain 232b, and the pixel electrode 232a which are elements predetermined to be electrically conductive.

For transmitting the electric signals, the pixel structure 200 further includes the data line 220c disposed on the substrate 210, located between the patterned semiconductor layer 232 and the substrate 210, and electrically connected to the source 232c of the thin film transistor structure 234. In addition, the gate electrode layer 254 further includes the gate line 254b electrically connected to the gate 254a of the thin film transistor structure 234. The gate line 254b and the data line 220c extends in different directions for respectively transmitting a control signal to the gate 254a and transmitting a data signal to the source 232c. Therefore, the thin film transistor structure 234 can be turned on by the control signal and the data signal can be transmitted to the pixel electrode 232a through the turned-on thin film transistor structure 234.

In the present embodiment, the gate line 254b is formed by using the same method of forming the gate 254a. Therefore, the insulation layer 242 includes a insulation portion 242a underlying the gate line 254b. The insulation portion 242a conforms in shape to the gate line 254b. The patterned semiconductor layer 232 further includes a semiconductor portion 232e underlying the gate line 254b and has a separating gap SG corresponding to the opening 230A shown in FIG. 14A and exposing a portion of the data line 220c. The semiconductor portion 232e partially conforms in shape to the gate line 154b. The gate line 254b, the insulation portion 242a and the semiconductor portion 232e form a gate line structure 256, where the gate line 254b and the insulation portion 242a of the gate line structure 256 cross over the data line 220c at the separating gap SG such that the semiconductor portion 232e is not in contact with the data line 220c and the insulation portion 242a of the insulation layer 242 fills in the separating gap SG and contacts the data line 220c for isolating the data line 220c from the gate line 254b. In other words, the insulation layer 242 patterned from the insulation material layer 240 fills the separating gap SG such as the semiconductor portion 232e of the gate lines structure 256 is electrically insulating to the data line 220c for preventing the short circuit between the data lines 220c and the semiconductor portion 232e of the gate lines structure 256. In the embodiment, a portion of the source 232c is in direct contact with the data line 220c by being in direct contact with the first metal portion 220a that branches off of the data line 220c, to electrically connect to the data line 220c. In addition, the pixel structure 200 is different from the pixel structure 100 in that it does not further include a second metal portion between the drain 232b and the pixel electrode 232a. The drain 232b and the pixel electrode 232a are connected to each other and made from the same patterned semiconductor layer 232.

Based on the above, it should be noted that, in the manufacturing process of the pixel structure of the embodiments, the photoresist layer is patterned by the photomask to form the patterned photoresist layer that includes the first thickness portion and the second thickness portion. This allows that patterned photoresist layer to act as a mask when etching different portions of the stacked structure. This further allows the manufacture of the pixel structure to require fewer masks. Thus, the manufacturing cost of the pixel structure of the invention can be effectively lowered.

In addition, when performing etching to expose the source and the drain, the channel is covered by the insulation layer. Thus, the channel of the semiconductor layer will not be damaged during the etching process. This allows the thin film transistor structure to have better reliability.

Furthermore, it can be seen that since the source, the drain, and the channel are of the same patterned semiconductor layer, the source, the drain, and the channel are electrically connected without requiring contact holes. In addition, the drain is electrically contacted with the pixel electrode without contact holes. This improves resolution or aperture ratio of the pixel structure. In addition, not requiring contact holes also saves space in the layout of the thin film transistor structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pixel structure, comprising:
a pixel electrode, disposed on a substrate;
a thin film transistor structure, disposed on the substrate and connected to the pixel electrode, the thin film transistor structure comprising a source, a drain, a channel and a gate formed by a gate electrode layer, wherein the pixel electrode, the source, the drain, and the channel belong to a same patterned semiconductor layer, a covered portion of the same patterned semiconductor layer is the channel, an exposed doped portion of the same patterned semiconductor layer comprises the pixel electrode, the source and the drain are located at two opposite sides of the channel, and the gate is located above the channel;
an insulation layer interposed between the patterned semiconductor layer and the gate electrode layer and having a shape substantially conformal to the gate electrode layer, wherein the insulation layer covers the covered portion of the patterned semiconductor layer to form the channel and exposes a exposed portion of the patterned semiconductor layer to form the pixel electrode, the source and the drain;
a data line disposed on the substrate, located between the patterned semiconductor layer and the substrate, and electrically connected to the source of the thin film transistor structure; and
a patterned metal portion disposed on the substrate, located and directly connected between the drain and the pixel electrode, wherein a material of the patterned metal portion and the data line is the same.

2. The pixel structure as claimed in claim 1, wherein a material of the patterned semiconductor layer comprises an oxide semiconductor material.

3. The pixel structure as claimed in claim 1, wherein the covered portion of the patterned semiconductor layer has a first conductivity type and the exposed portion of the patterned semiconductor layer has a second conductivity type more conductive than the first conductivity type.

4. The pixel structure as claimed in claim 1, wherein the gate electrode layer further comprises a gate line electrically connected to the gate of the thin film transistor structure, the insulation layer comprises an insulation portion underlying the gate line, the patterned semiconductor layer further comprises a semiconductor portion underlying the gate line, and the gate line, the insulation portion and the semiconductor portion form a gate line structure.

5. The pixel structure as claimed in claim 4, wherein the patterned semiconductor layer has a separating gap exposing a portion of the data line, the insulation portion fills the separating gap and contacts the portion of the data line, and the semiconductor portion of the gate line structure is electrically insulating to the data line.

6. The pixel structure as claimed in claim 1, wherein a portion of the source is in direct contact with the data line to electrically connect to the data line.

7. The pixel structure as claimed in claim 1, wherein the material of the patterned metal portion is different from a material of the drain and the pixel electrode.

* * * * *